(12) United States Patent
Kitaguchi

(10) Patent No.: US 6,594,477 B1
(45) Date of Patent: Jul. 15, 2003

(54) ELECTRONIC TUNER

(75) Inventor: Masanori Kitaguchi, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 340 days.

(21) Appl. No.: 09/640,706

(22) Filed: Aug. 18, 2000

(30) Foreign Application Priority Data

Aug. 20, 1999 (JP) .......................................... 11-234651

(51) Int. Cl.[7] .............................................. H04B 1/26
(52) U.S. Cl. .................... 455/314; 455/313; 455/150.1; 334/1
(58) Field of Search ........................... 455/189.1, 190.1, 455/191.1, 193.2, 194.2, 196.1, 183.1, 178.1, 313, 314, 315, 316, 318, 341, 526, 87, 150.1; 334/1, 17

(56) References Cited

U.S. PATENT DOCUMENTS

| | | | |
|---|---|---|---|
| 4,527,280 A | * | 7/1985 | Ijichi et al. ..................... 331/49 |
| 4,590,612 A | * | 5/1986 | Ijichi .............................. 334/1 |
| 6,308,056 B1 | * | 10/2001 | Abe et al. ..................... 455/301 |

FOREIGN PATENT DOCUMENTS

| | | |
|---|---|---|
| JP | 234013 | 2/1990 |
| JP | 4117013 | 4/1992 |
| JP | 8125451 | 5/1996 |
| JP | 9139646 | 5/1997 |
| JP | 09181624 A | * 7/1997 ............ H04B/1/10 |

* cited by examiner

Primary Examiner—William Trost
Assistant Examiner—Congvan Tran
(74) Attorney, Agent, or Firm—Birch, Stewart, Kolasch & Birch, LLP

(57) ABSTRACT

A double conversion-type electronic tuner includes a first IF signal amplifying circuit having a field-effect transistor that amplifies an intermediate frequency signal at a predetermined gain, and input the resultant signal to a downconverter via a band-pass filter. The electronic tuner further includes a temperature compensating section formed by a serial circuit composed of an NTC-thermistor provided between the first IF signal amplifying circuit and a coupling capacitor of the band-pass filter. In this structure, when the temperature is changed, the degree of coupling between the circuits is varied to compensate for a variation of the gain caused by a change in temperature. Moreover, the characteristic of a capacitor forming a parallel resonant circuit in the band-pass filter is also varied by a change in temperature, and the matching loss is reduced.

15 Claims, 20 Drawing Sheets

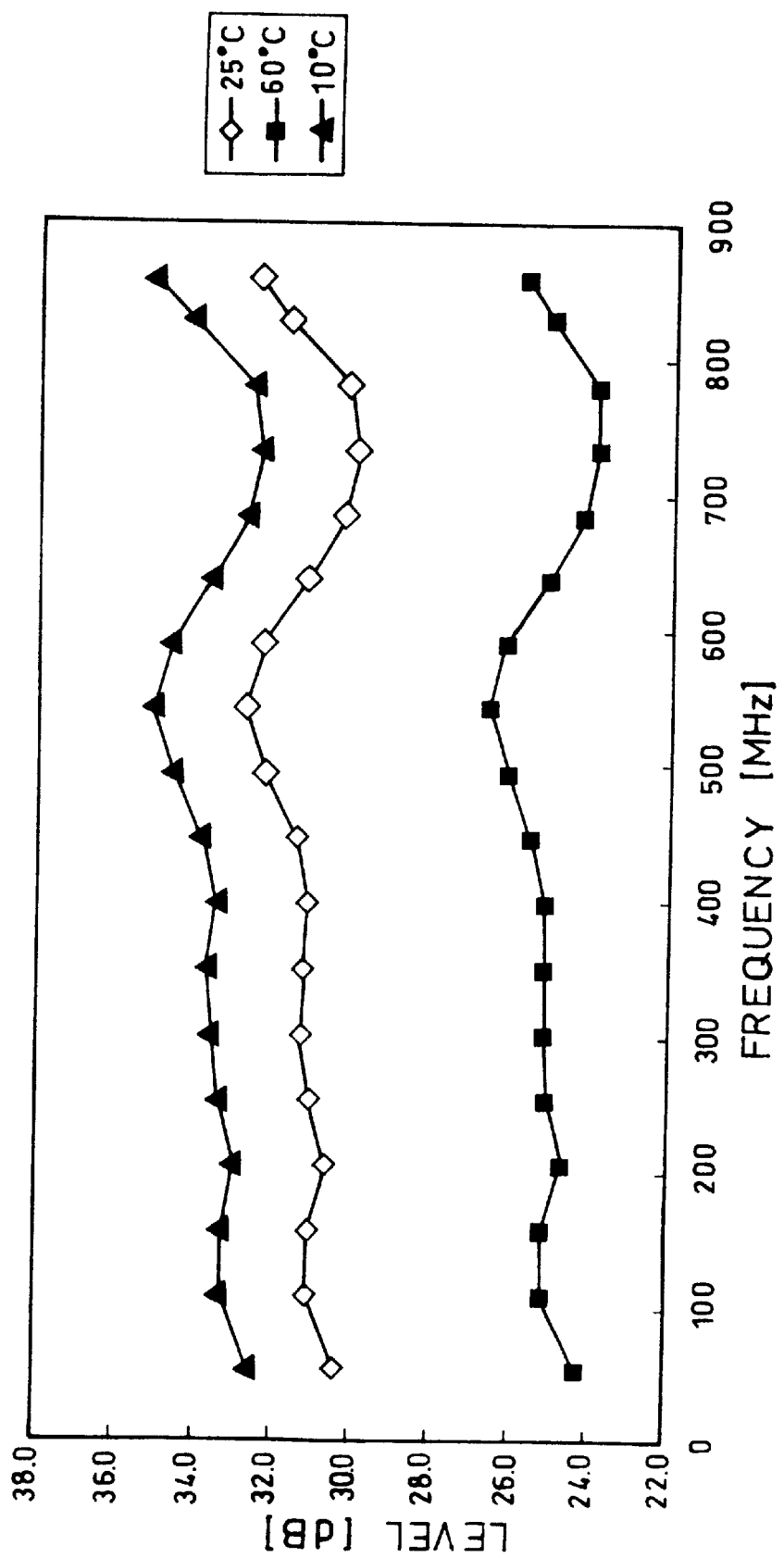

ELECTRONIC TUNER

FIELD OF THE INVENTION

The present invention relates to an electronic tuner for use in high frequency circuit devices, such as a cable television receiver, a television receiver and a video tape recorder.

BACKGROUND OF THE INVENTION

For example, a tuner circuit of a television receiver or the like selects a signal of a desired channel from television signals in the VHF or UHF band received using an antenna, converts it into an intermediate frequency and supplies the resultant signal to a demodulation circuit located in the succeeding stage. Here, the CATV system can transmit tens to a hundred and tens of programs, and a CATV receiver for receiving these programs uses a double conversion-type electronic tuner that is particularly effective for receiving multi-channel programs.

For instance, as shown in FIG. 18, in the above-mentioned conventional tuner 101, a RF (Radio Frequency) signal received by the antenna is input to an up-converter 103 via a band-pass filter 102a, a PIN attenuator 102b and a RF amplifier 102c, and mixed with a first local oscillator signal Lo1 of a frequency selected according to a received channel by a first mixer circuit 103 of the up-converter 103. Thus, the RF signal is converted into a first intermediate frequency signal IF1 of a higher frequency.

Moreover, the first intermediate frequency signal IF1 is input to a first IF signal amplifying circuit 105 via a band-pass filter 104. After the first intermediate frequency signal IF1 is amplified by the first IF signal amplifying circuit 105, it is applied to a down-converter 107 via a band-pass filter 106. In the down-converter 107, the output of the band-pass filter 106 is mixed with a second local oscillator signal Lo2 in a second mixer circuit 171 as in the up-converter 103. Hence, the first intermediate frequency signal IF1 is converted into a second intermediate frequency signal IF2 of a frequency lower than the RF signal, and output via a band-pass filter 108 and a second IF signal amplifying circuit 109.

Here, in order to make the level of the second intermediate frequency signal IF2 output by the electronic tuner 101 constant irrespective of variations in the strength of the received signal, an automatic gain control (AGC) signal is applied to the PIN attenuator 102b to control the amount of attenuation. Incidentally, the first (second) local oscillator signal is generated by a first (second) local oscillator circuit 133 (173), amplified by a local oscillator signal amplifying circuit 132 (172), and then applied to the first (second) mixer circuit 131 (171).

The double conversion-type electronic tuner 101 with the above-described structure increases the frequency of the RF signal by the up-converter 103 and decreases the frequency by the down-converter 107. It is therefore possible to select a desired channel even from a CATV broadcast that transmits multi-channel programs while efficiently removing disturbance.

Here, in the electronic tuner 101, for example, the circuits following the up-converter 103 are configured as shown in FIG. 19. Specifically, the first IF signal amplifying circuit 105 includes a bipolar transistor T151 with a grounded emitter, and the output of the first IF signal amplifying circuit 105 is input to the second mixer circuit 171 of the down-converter 107 via the band-pass filter 106 composed of a double-tuned circuit. Moreover, the second mixer circuit 171 includes a bipolar transistor T171 with a grounded base, and the second local oscillator signal Lo2 is input together with the first intermediate frequency signal IF1 to the emitter of the bipolar transistor T171 serving as an input terminal and converted into the second intermediate frequency signal IF2. The second intermediate frequency signal IF2 is input to a second IF signal amplifying circuit 109 via a band-pass filter 108 composed of a double-tuned circuit like the band-pass filter 106.

However, in the above-described conventional structure, in order to ensure disturbance characteristics durable to the input of a greater number of channels because of the digitalization of the CATV broadcast, the power consumed by the electronic tuner is increased and the inner temperature of the electronic tuner rises considerably. Moreover, it is necessary to add a digital signal processing circuit to meet the digitalization of the CATV broadcast, and consequently the heating value of the electronic tuner is increased in comparison with an electronic tuner configuration for receiving only an analog broadcast. As a result, the range of temperature variations in the electronic tuner is increased in comparison with the electronic tuner configuration for receiving only an analog broadcast, causing a problem that the electrical performance such as the gain and distortion characteristics of the electronic tuner deteriorates.

For instance, in the electronic tuner 101 with the configuration shown in FIG. 19, the gain in the circuits 151 and 171 including the bipolar transistor T151 (171) is varied with a change in temperature. Therefore, for example, as shown in FIG. 20, the level of the second intermediate frequency signal IF2 output by the electronic tuner 101 is varied within a range of around 24 [dB] to around 35 [dB] in a frequency band from 100 [MHz] to 800 [MHz] at 10° C., 25° C. and 60° C.

SUMMARY OF THE INVENTION

An object of the present invention is to provide an electronic tuner of high quality by reducing deterioration of the electrical characteristics of the electronic tuner caused by a rise in temperature, without adding a complicated temperature compensating circuit.

In order to achieve the above object, an electronic tuner of the present invention includes:

an up-converter for converting an input high frequency signal into a first intermediate frequency signal of a frequency higher than the high frequency signal;

a down-converter for converting the first intermediate frequency signal into a second intermediate frequency signal of a frequency lower than the high frequency signal;

a high frequency amplifying circuit, disposed on a signal transmission path between an input of the high frequency signal and an output of the second intermediate frequency signal as an output signal, for amplifying an input signal; and a temperature compensating section for compensating for deterioration of electrical characteristics caused by a change in temperature.

According to this structure, even when the ambient temperature is changed a lot as in a digital CATV broadcast receiver in comparison with an analog broadcast receiver, it is possible to achieve an electronic tuner that has less deterioration of electrical performance such as the gain and distortion characteristics of the electronic tuner and has a simple circuit structure by providing the temperature compensating section.

It is preferable that the electronic tuner further includes a filter circuit, disposed on the signal transmission path between an input of the high frequency signal and an output of the second intermediate frequency signal as an output signal, for passing frequency components in a predetermined band, the high frequency circuit includes a field-effect transistor as an amplifying element, and the temperature compensating section includes:

a thermistor that is disposed in a preceding stage or succeeding stage of the filter circuit and has such a characteristic that resistance is decreased in substantially proportion to a rise in temperature within a predetermined temperature range; and a serial circuit composed of the thermistor and a coupling capacitor of the filter circuit.

According to this structure, the high frequency amplifying circuit includes the field-effect transistor as an amplifying element, and the temperature compensating section includes the thermistor, which is disposed in the preceding stage or succeeding stage of the filter circuit and has such a characteristic that resistance is decreased in substantially proportion to a rise in temperature within a predetermined temperature range, and the serial circuit composed of the thermistor and the coupling capacitor of the filter circuit. Incidentally, the high frequency amplifying circuit may be a mixer circuit, or a high frequency circuit for amplifying the high frequency signal, or first or second intermediate frequency signal.

In this structure, the gain in the high frequency amplifying circuit having the field-effect transistor is decreased in substantially proportion to the temperature. On the other hand, since the resistance of the thermistor is decreased in substantially proportion to a rise in temperature, the degree of coupling between the circuit provided in the preceding stage of the temperature compensating section and the circuit provided in the succeeding stage is increased. As a result, the level of the signal output by the temperature compensating section is increased, and thereby compensating for a decrease of the gain in the high frequency amplifying circuit. Here, the coupling capacitor of the filter circuit is also used for temperature compensation. Consequently, it is possible to achieve an electronic tuner that provides a substantially constant output signal level within the above-mentioned temperature range by a simple circuit structure obtained by only adding the thermistor. As a result, for example, even when the present invention is applied to an electronic tuner in which the temperature tends to increase as in a multi-channel digital CATV broadcast receiver in comparison with an analog broadcast receiver or a receiver for a small number of channels, it is possible to realize a high-quality electronic tuner that limits the deterioration of electrical characteristics such as the gain and distortion characteristics.

Furthermore, it is preferable that the filter circuit is a double-tuned circuit including a primary resonant circuit and a secondary resonant circuit, between which the resonant circuit on the thermistor side has a resonant capacitor with a temperature characteristic that is set to achieve impedance matching with the thermistor, coupling capacitor and high frequency amplifying circuit even when temperature is changed.

According to this structure, since the temperature characteristic of the resonant capacitor is set as described above, it is possible to limit the occurrence of matching loss resulting from a change in temperature. As a result, despite a simple circuit structure obtained by only adding the thermistor, it is possible to provide a high-quality electronic tuner that achieves a high S/N ratio.

Besides, in the structure where the high frequency amplifying circuit includes a dual-gate field-effect transistor as an amplifying element, it is preferable to use a thermistor that is disposed between a gain control terminal of the dual-gate field-effect transistor and a negative power supply line and has such a characteristic that the resistance is increased in substantially proportion to a rise in temperature within a predetermined temperature range as a thermistor in the temperature compensating section.

According to this structure, even when the temperature compensating section of the present invention is provided, for example, in the mixer circuit of the up-converter, it is possible to provide the same effect.

Moreover, the electronic tuner of the present invention may include a plurality of temperature compensating sections.

For instance, in the above structure, the up-converter or down-converter may include:

a local oscillator circuit for generating a local oscillator signal of a predetermined frequency;

a local oscillator signal amplifying circuit for amplifying an output of the local oscillator circuit;

a mixer circuit for mixing an output of the local oscillator signal amplifying circuit and an input signal so as to generate the first intermediate frequency signal; and a second temperature compensating section, provided on at least a signal transmission path between the local oscillation circuit and the mixer circuit, for compensating for deterioration of electrical characteristics caused by a change in temperature.

With this structure, it is possible to further limit the deterioration of the electronic tuner caused by a change in temperature in comparison with a structure including only one temperature compensating section.

For a fuller understanding of the nature and advantages of the invention, reference should be made to the ensuing detailed description taken in conjunction with the accompanying drawings.

BRIEF DESCRIPTION OF THE DRAWINGS

FIG. 20 is a graph showing the temperature characteristic of the above electronic tuner by the relationship between the output signal level and the frequency at a plurality of temperatures.

DESCRIPTION OF THE PREFERRED EMBODIMENTS

[First Embodiment]

The following description will explain an embodiment of the present invention with reference to FIG. 1 through FIG. 8.

Figure 2:
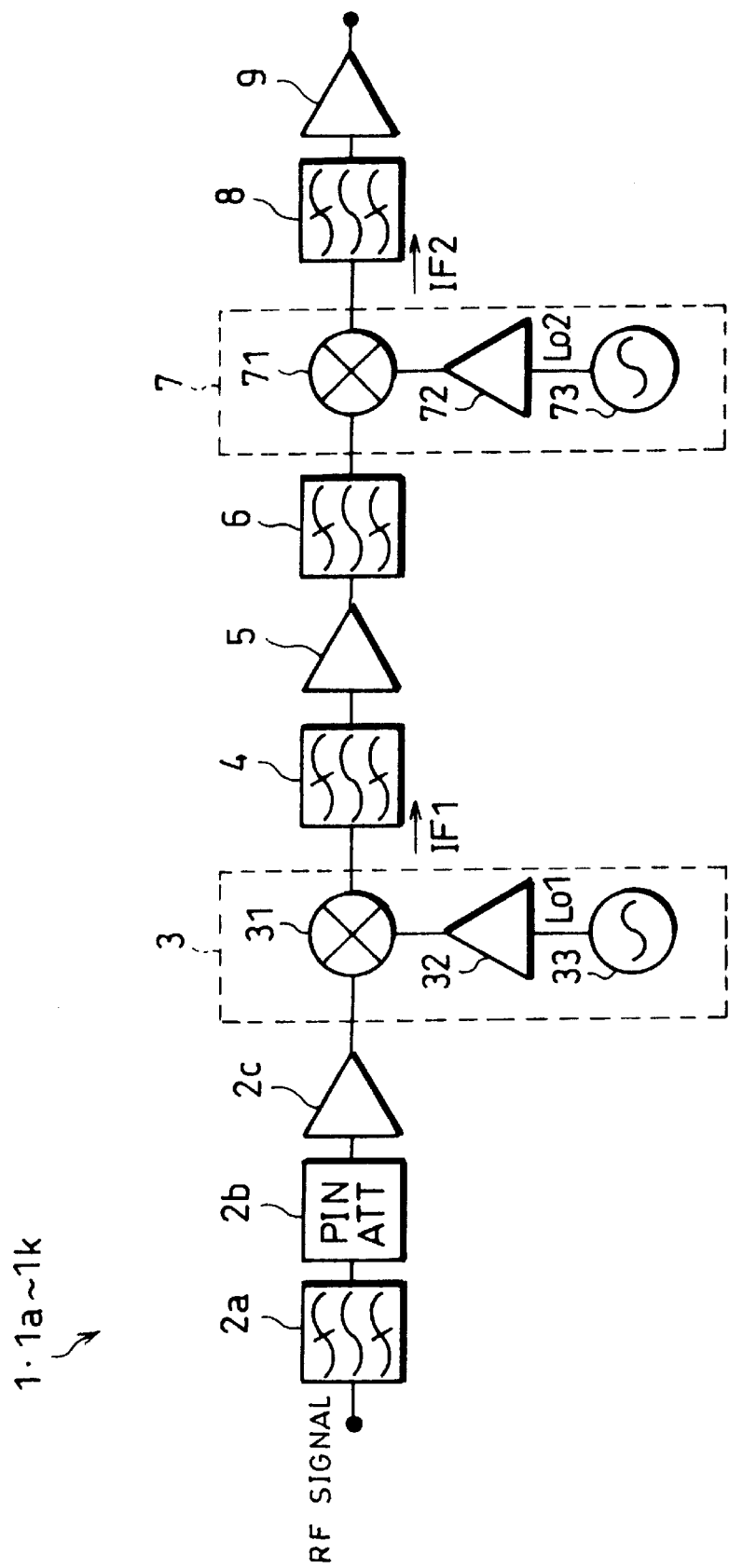
FIG. 2 is a block diagram showing a schematic structure of the essential section of the electronic tuner.

An electronic tuner according to this embodiment is a double conversion-type electronic tuner suitable for receiving a digital CATV broadcast. For example, as shown in FIG. 2, this electronic tuner includes an LRF signal amplifying circuit 2c (high frequency amplifying circuit) for amplifying an RF signal input to an electronic tuner 1 via a band-pass filter 2a and a PIN attenuator 2b, an up-converter 3 for mixing the RF signal output from the RF signal amplifying circuit 2c with a first local oscillator signal Lo1 of a predetermined frequency to generate a first intermediate frequency signal IF1 of a higher frequency than the RF signal, a first IF signal amplifying circuit 5 for amplifying the first intermediate frequency signal IF1 supplied via a band-pass filter 4 (filter circuit), a down-converter 7 for mixing the output of the first IF signal amplifying circuit 5 (high frequency amplifying circuit) supplied via a band-pass filter 6 (filter circuit) with a second local oscillator signal Lo2 of a predetermined frequency so as to generate a second intermediate frequency signal IF2 of a lower frequency than the RF signal, and a second IF signal amplifying circuit 9 (high frequency amplifying circuit) for amplifying the second intermediate frequency signal IF2 supplied via a band-pass filter 8 (filter circuit) and outputting the resultant signal.

Figure 1:
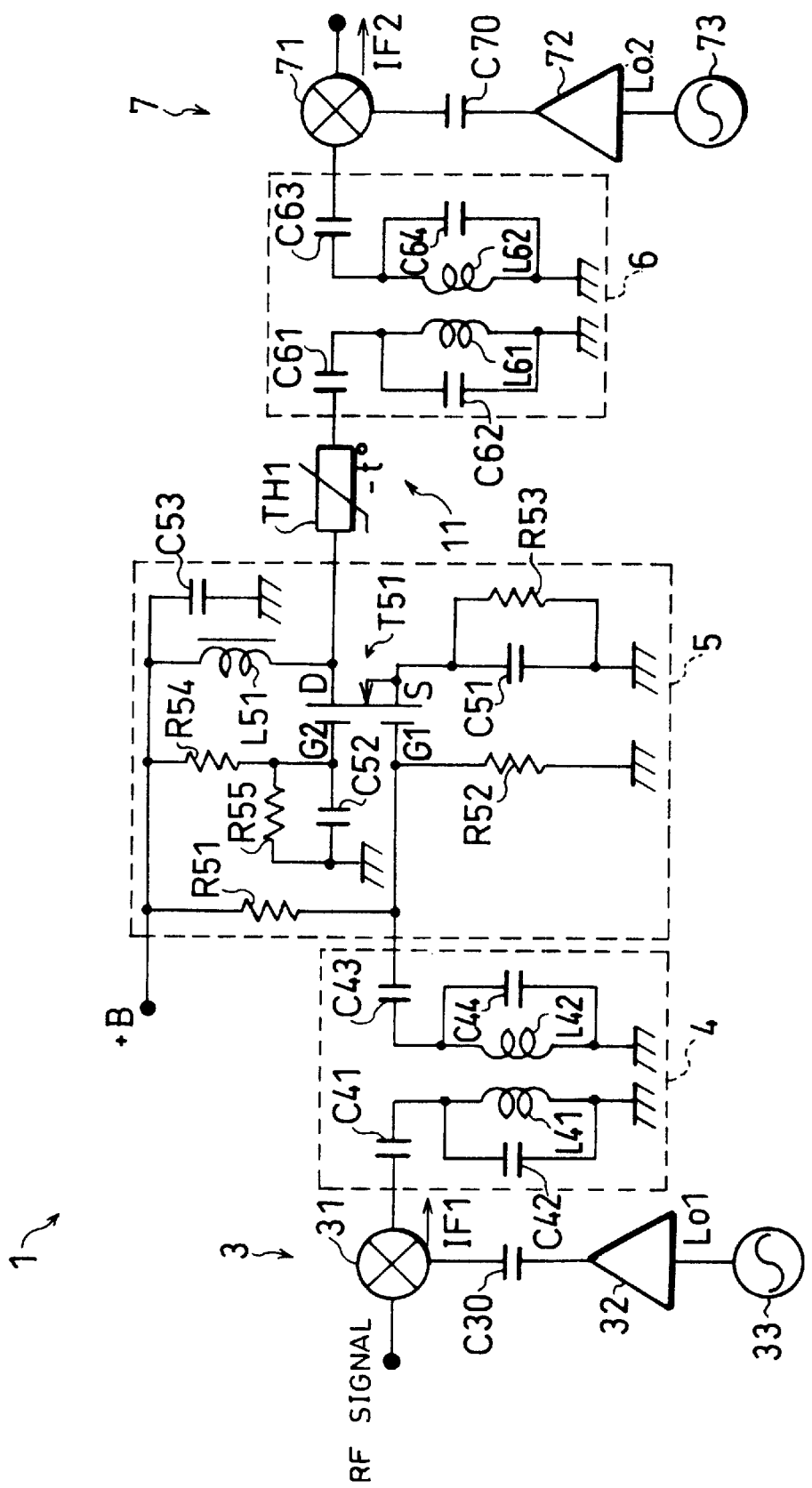
FIG. 1 is a circuit diagram showing the vicinity of a temperature compensating section of an electronic tuner according to one embodiment of the present invention.

The up-converter 3 includes a first mixer circuit 31 (mixer circuit, high frequency amplifying circuit), a capacitor C30 (coupling capacitor) shown in FIG. 1, a first local oscillation-use amplifying circuit 32 (local oscillation-use amplifying circuit), and a first local oscillator circuit 33 (local oscillator circuit). The local oscillator signal Lo1 generated by the first local oscillator circuit 33 is applied to the first mixer circuit 31 via the first local oscillation-use amplifying circuit 32 and coupling capacitor C30, and mixed with the RF signal. Similarly, the down-converter 7 includes a second mixer circuit 71 (mixer circuit, high frequency amplifying circuit), a capacitor C70 (coupling capacitor) (see FIG. 1), a second local oscillation-use amplifying circuit 72 (local oscillation-use amplifying circuit), and a second local oscillator circuit 73 (local oscillator circuit).

Besides, the band-pass filter 4 is composed of a double-tuned circuit. For instance, as shown in FIG. 1, the band-pass filter 4 includes: a primary resonant circuit including a capacitor C41 whose input terminal is connected to the first mixer circuit 31, and a parallel circuit that is connected to the other terminal of the capacitor C41 and composed of a capacitor C42 and a coil L41; and a secondary resonant circuit including a capacitor C43 (coupling capacitor) whose output terminal is connected to the first IF signal amplifying circuit 5, and a parallel circuit that is connected to the other terminal of the capacitor C43 and composed of a capacitor C44 (resonant capacitor) and a coil L42. Incidentally, the terminal of each of the parallel circuits on the opposite side to the capacitor C41 (C43) is grounded. Moreover, the band-pass filter 6 (8) is a double-tuned circuit like the band-pass filter 4, and includes capacitors C61 to C64, L61 and L62 (C81 to C84, L81 and L82) connected in the same manner as above. The resonant frequency of each of the band-pass filters 4, 6 and 8 is set according to the frequency of a signal (IF1, IF2) to be passed. Among the band-pass filters 4, 6 and 8, a filter connected to a later-described NTC (negative temperature coefficient)-thermistor TH1 (thermistor) corresponds to a filter circuit recited in the claims.

Meanwhile, the first IF signal amplifying circuit 5 is a high frequency amplifying circuit having a dual-gate-type field-effect transistor T51 with a grounded source as an amplifying element, in which a first gate terminal G1 as an input terminal is connected to a bias voltage +B (positive power supply line) via a bias resistor R51 and to a ground level GND (negative power supply line) via a resistor R52. Besides, the source S of the transistor T51 is grounded via a parallel circuit composed of a capacitor C51 and a resistor R53, and a bias choke coil L51 is provided between the drain D as an output terminal and the bias voltage +B. Moreover, a gain control gate terminal G2 is connected to the bias voltage +B via a bias resistor R54 and grounded via a parallel circuit composed of a bias resistor R55 and a bias capacitor C52. Incidentally, the bias voltage +B is grounded via a capacitor C53.

Figure 3:
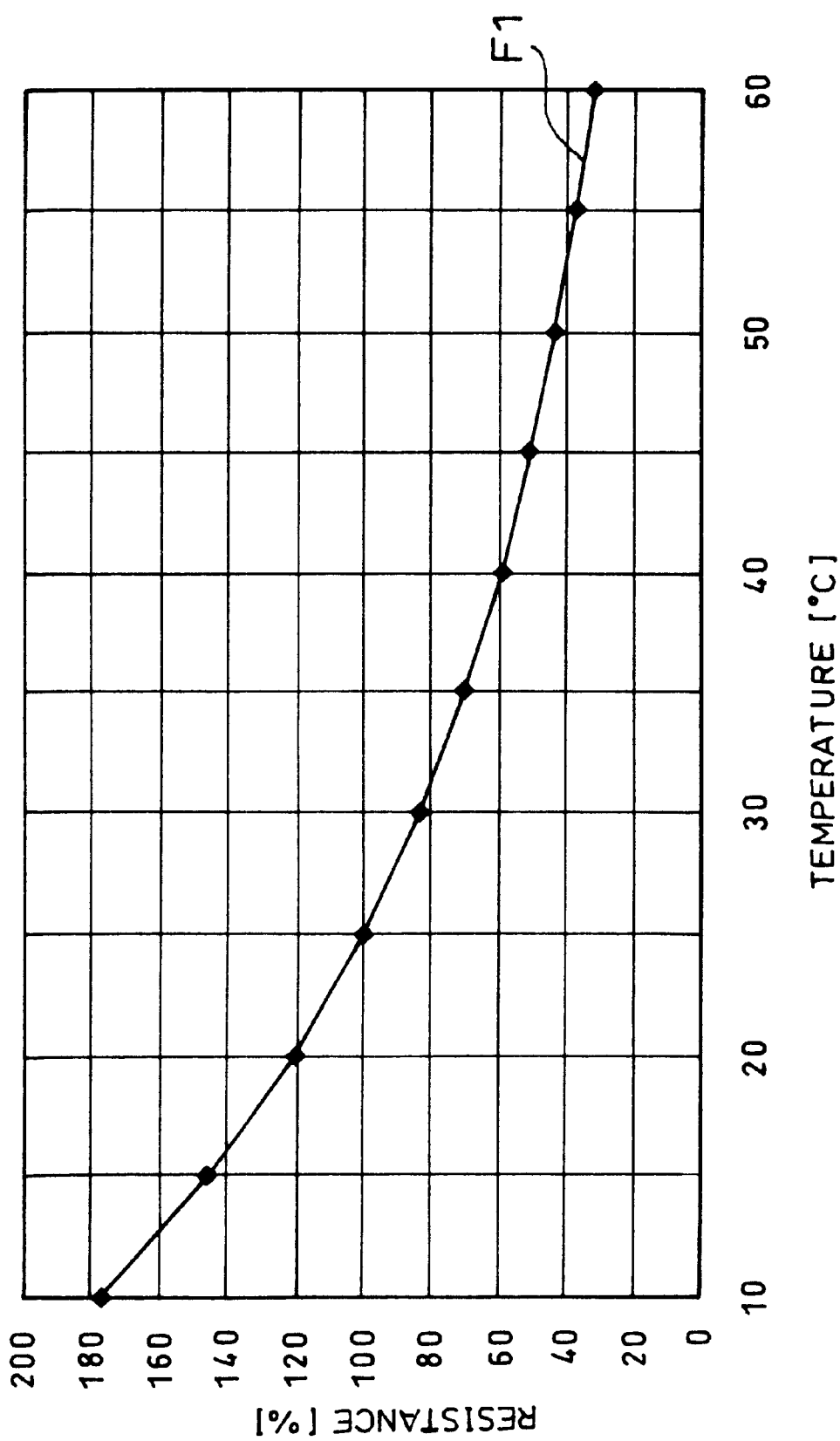
FIG. 3 is a graph showing the temperature characteristic of an NTC-thermistor provided in the temperature compensating section by the relationship between the temperature and resistance.
Figure 4:
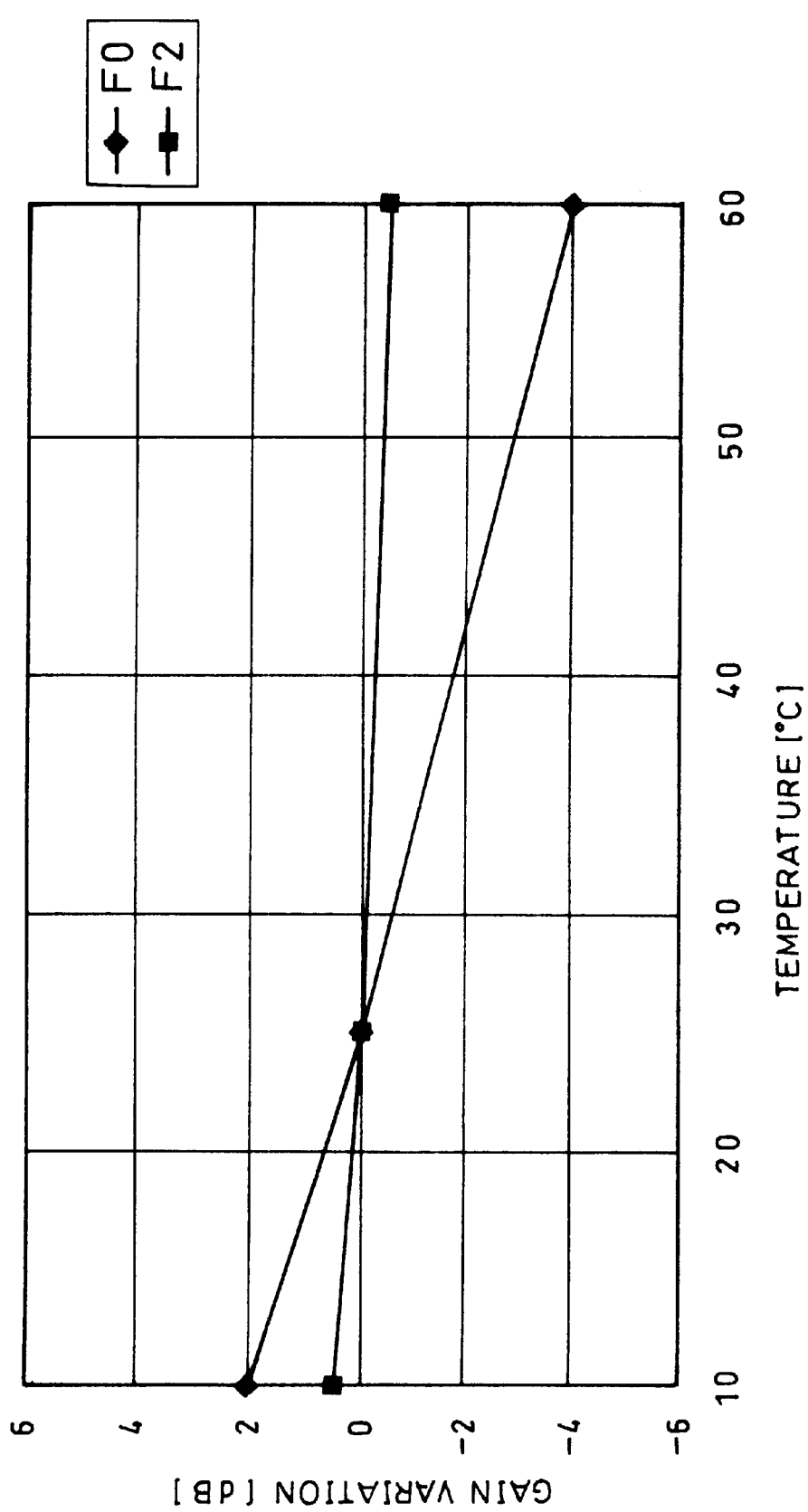
FIG. 4 is a graph showing the temperature characteristic of a first IF signal amplifying circuit of the electronic tuner by the relationship between the temperature and gain in a configuration including a temperature compensating section and that in a configuration including no temperature compensating section.

Furthermore, in order to cancel a gain variation of the first IF signal amplifying circuit 5 caused by a change in temperature, the electronic tuner 1 of this embodiment includes a temperature compensating section 11 between the first IF signal amplifying circuit 5 and the band-pass filter 6. The temperature compensating section 11 is composed of a serial circuit including the NTC-thermistor TH1 and capacitor C61 (coupling capacitor). As the NTC-thermistor TH1, this embodiment selects a thermistor having a resistance characteristic, such as a temperature characteristic F1 shown in FIG. 3, which cancels a temperature characteristic F0 of the gain in the first IF signal amplifying circuit 5 shown in FIG. 4, more specifically, such a characteristic that the resistance is lowered in substantially proportion to a rise in temperature. In this embodiment, for example, a thermistor having the B constant of 3250 K at 150 Ω/25° C. is used as an example of the NTC-thermistor TH1, and the resistance is lowered from around 180% to around 30% at temperatures between 10° C. and 60° C. Here, the B constant is defined by equation (1).

$$B \text{ constant} = [\ln(R1) - \ln(R2)]/[(1/T1) - (1/T2)] \quad (1)$$

where T1 and T2 are mutually different arbitrary temperatures (K), and R1 and R2 are zero-power resistances (Ω) at temperatures T1 and T2, respectively. In FIG. 3, the resistance at 25° C. is shown as 100%. Moreover, in order to use the NTC-thermistor TH1 in a high frequency circuit, the NTC-thermistor TH1 having a small floating capacity is selected.

On the other hand, in this embodiment, the capacitor C61 of the band-pass filter 6 is used as the capacitor C61 for temperature compensation. The capacity of the capacitor C61 is set to an extremely small value of not higher than 10 [pF], for example, 0.3 [pF]. Furthermore, in the band-pass filter 6, a capacitor having a temperature characteristic that limits the matching loss caused by a change in temperature, for example, a temperature characteristic of −470 ppm/° C., is selected as the capacitor C62 (resonant capacitor) connected to the capacitor C61.

In the above structure, the output of the first IF signal amplifying circuit 5 is connected to a parallel resonant circuit composed of the coil L61 and capacitor C62 via the serial circuit of the NTC-thermistor TH1 and coupling capacitor C61. Here, as described above, since the resistance of the NTC-thermistor TH1 varies with a change in temperature, the degree of coupling between the first IF signal amplifying circuit 5 and the parallel resonant circuit is varied with a change in temperature.

Therefore, in a high temperature condition, the resistance of the NTC-thermistor TH1 decreases and the degree of coupling between the parallel resonant circuit and the first IF signal amplifying circuit 5 is increased. As a result, the level of the first intermediate frequency signal IF1 input to the down-converter 7 increases, thereby compensating for a decrease of the gain in a semiconductor (field-effect transistor T51) caused by an increase in temperature. On the contrary, in a low temperature condition, the resistance of the NTC-thermistor TH1 increases and the degree of coupling between the first IF signal amplifying circuit 5 and the parallel resonant circuit composed of the coil L61 and capacitor C62 is decreased. As a result, the level of the first intermediate frequency signal IF1 input to the down-converter 7 decreases, thereby compensating for an increase of the gain in the semiconductor caused by a lowering of temperature. Moreover, as described above, since the temperature characteristic of the capacitor C62 is set so as to optimize the matching characteristic due to a change in temperature, the matching loss is limited to a minimum value even when the temperature changes.

Hence, in comparison with a structure having no temperature compensating circuit, although this embodiment has an extremely simple circuit structure obtained by simply adding the NTC-thermistor TH1, the temperature characteristic F2 of the gain in the first IF signal amplifying circuit 5 is kept at a substantially constant value within 0.5 [dB] even when the temperature changes from 10° C. to 60° C.

Figure 5:
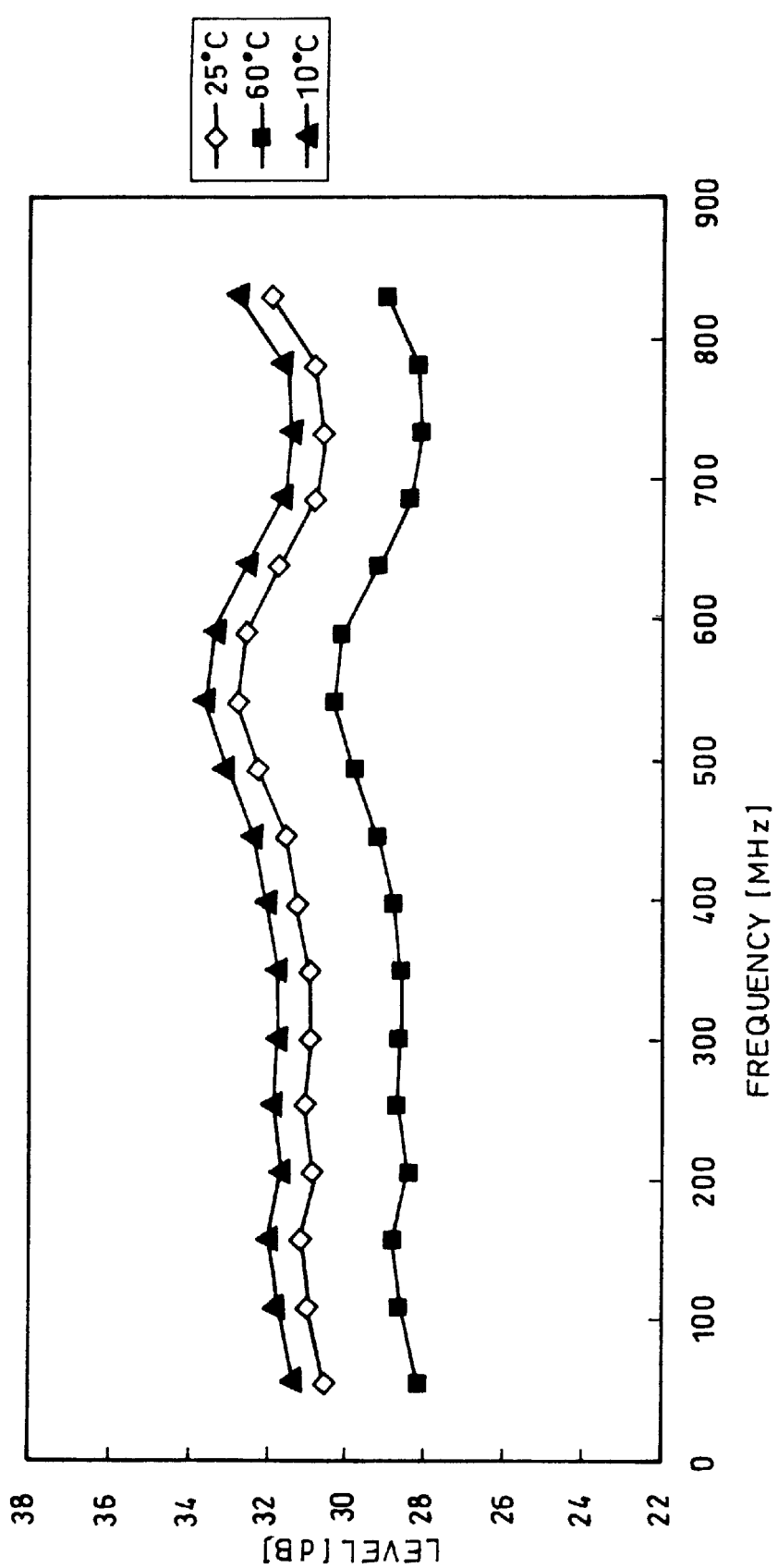
FIG. 5 is a graph showing the temperature characteristic of the electronic tuner by the relationship between the output signal level and the frequency at a plurality of temperatures.
Figure 6:
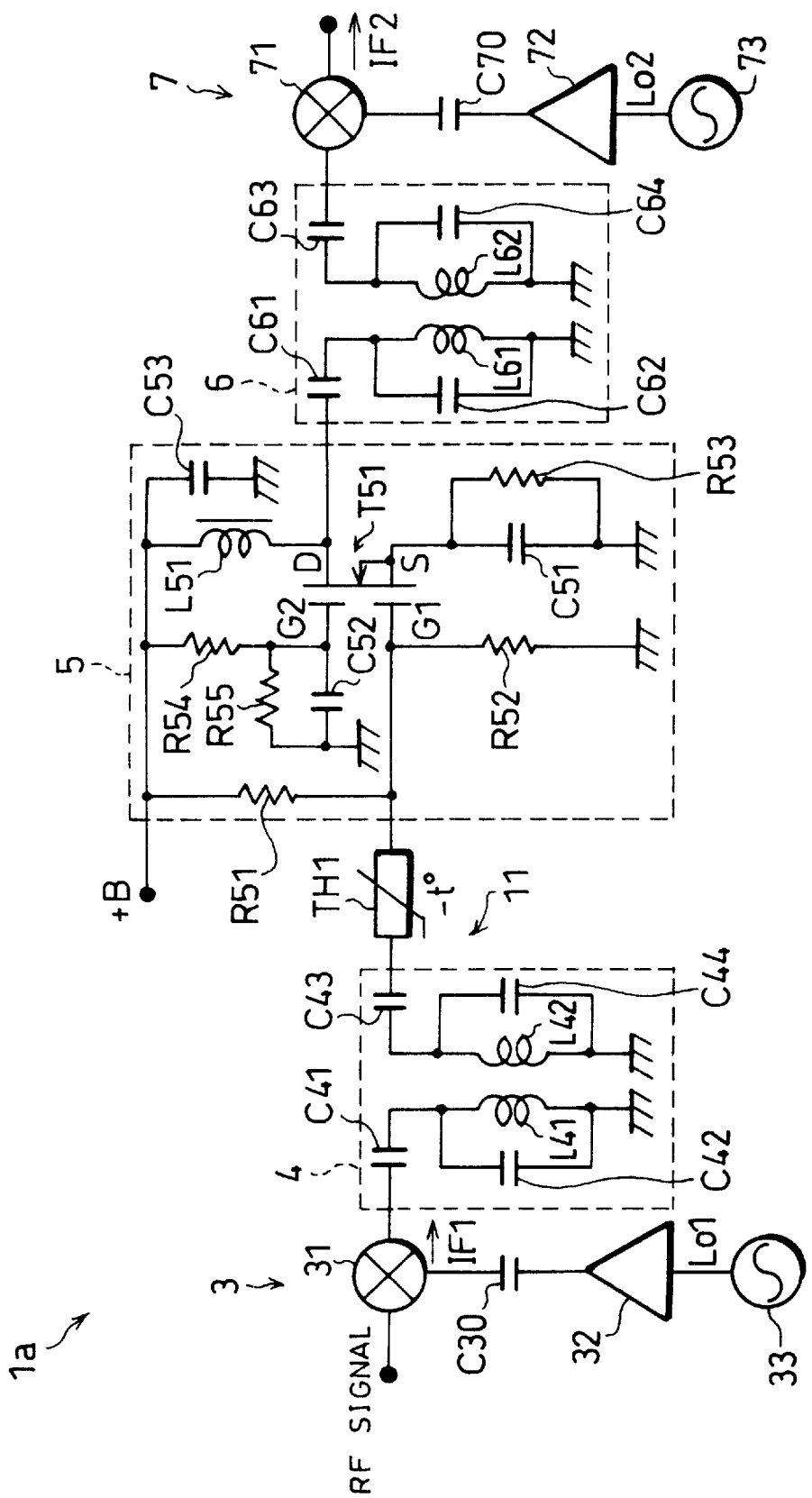
FIG. 6 is a circuit diagram showing the vicinity of the temperature compensating section of an electronic tuner as a modified example of the above electronic tuner.

Consequently, for example, as shown in FIG. 5, the variation of the level of the second intermediate frequency signal IF2 output by the electronic tuner 1 is limited within a range of 28 [dB] to 34 [dB] in a frequency band from 100 [MHz] to 800 [MHz] at 10° C., 25° C. and 60° C. As a result, in the characteristic of the structure having no temperature compensation circuit shown in FIG. 20, i.e., in the above temperatures and frequency band, it is possible to significantly improve the temperature characteristic in comparison with the variation from 24 [dB] to 36 [dB] Thus, even in a structure like a receiver of the digital CATV broadcast in which the ambient temperature changes a lot in comparison with an analog broadcast receiver, it is possible to achieve the electronic tuner 1 that shows less deterioration of the electric performance such as the gain and distortion characteristics and has a simple circuit structure.

FIG. 1 illustrates an example in which the temperature compensating section 11 is provided between the first IF signal amplifying circuit 5 and the band-pass filter 6. However, like an electronic tuner 1*a* shown in FIG. 6, it is possible to provide the NTC-thermistor TH1 of the temperature compensating section 11 between the band-pass filter 4 and the first IF signal amplifying circuit 5. In this case, the capacitor C43 of the band-pass filter 4 can also be used for temperature compensation. Moreover, the temperature characteristic of the capacitor C44 of the parallel resonant circuit connected to the temperature compensating section 11 is set in the same manner as in the capacitor C62 shown in FIG. 11. Consequently, the degree of coupling between the band-pass filter 4 and the first IF signal amplifying circuit 5 is varied according to temperatures, and a variation of the gain in the first IF signal amplifying circuit caused by a change in temperature is compensated. As a result, like FIG. 1, even when the ambient temperature changes a lot, it is possible to achieve the electronic tuner 1 that shows less deterioration of the electric performance such as the gain and distortion characteristics and has a simple circuit structure.

Figure 7:
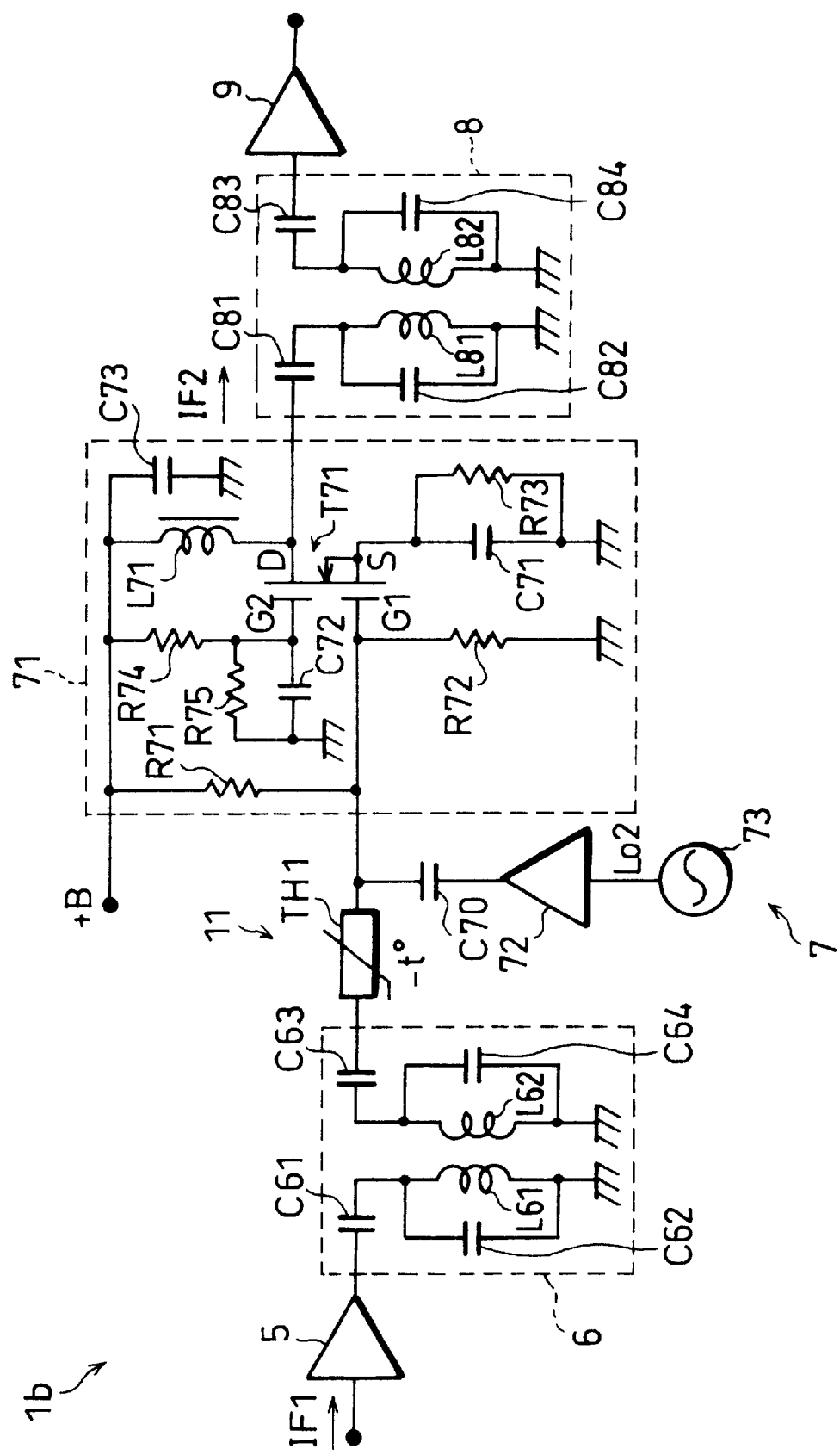
FIG. 7 is a circuit diagram showing the vicinity of the temperature compensating section of an electronic tuner as another modified example of the above electronic tuner.

As another example of the arrangement, the temperature compensating section 11 is positioned between the band-pass filter 6 and the second mixer circuit 71. More specifically, as shown in FIG. 7, the second mixer circuit 71 according to this embodiment includes a dual-gate-type field-effect transistor T71, resistors R71 to R75, capacitors C71 to C73 and a choke coil L71 connected in the same manner as in the first IF signal amplifying circuit 5 shown in FIG. 1. Moreover, in the second mixer circuit 71, the local oscillator signal Lo2 from the second local oscillator circuit 73 is applied to a first gate terminal G1 of the transistor T71 via the second local oscillation-use amplifying circuit 72 and the capacitor C70. Furthermore, the first intermediate frequency signal IF1 is input to the gate terminal G1.

In an electronic tuner 1*b* of this modified example, the NTC-thermistor TH1 of the temperature compensating section 11 is positioned between the gate terminal G1 of the second mixer circuit 71 and the capacitor C63 of the band-pass filter 6. In this case, the capacitor C63 of the band-pass filter 6 is also used for temperature compensation, and the temperature characteristic of the capacitor C64 (resonant capacitor) of the parallel resonant circuit connected to the temperature compensating section 11 is set in the same manner as in the capacitor C62 shown in FIG. 1. Consequently, the degree of coupling between the band-pass filter 6 and the second mixer circuit 71 is varied according to temperatures, and a variation of the gain in the second mixer circuit 71 caused by a change in temperature is compensated. As a result, like FIG. 1, even when the ambient temperature changes a lot, it is possible to achieve the electronic tuner 1b that shows less deterioration of the electric performance such as the gain and distortion characteristics and has a simple circuit structure.

Figure 8:
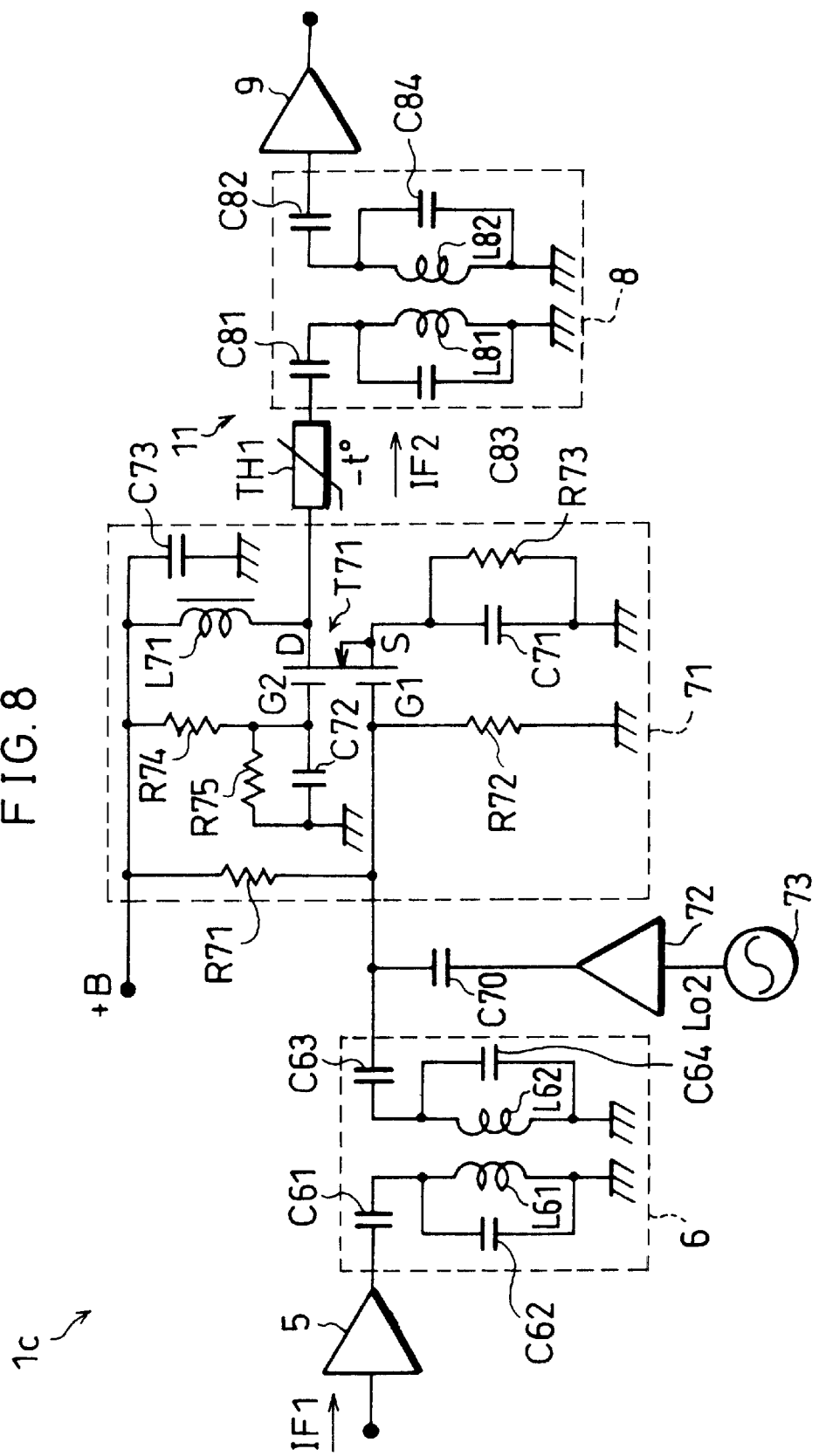
FIG. 8 is a circuit diagram showing the vicinity of the temperature compensating section of an electronic tuner as still another modified example of the above electronic tuner.

As still another example of the arrangement, for example, as shown in FIG. 8, the temperature compensating section 11 is positioned between the band-pass filter 8 and the second mixer circuit 71. In this case, the capacitor C81 (coupling capacitor) of the band-pass filter 8 is also used for temperature compensation, and the temperature characteristic of the capacitor C83 (resonant capacitor) of the parallel resonant circuit connected to the temperature compensating section 11 is set in the same manner as in the capacitor C62 shown in FIG. 1. Consequently, the degree of coupling between the band-pass filter 8 and the second mixer circuit 71 is varied according to temperatures, and a variation of the gain in the second mixer circuit 71 caused by a change in temperature is compensated. As a result, like FIG. 1, even when the ambient temperature changes a lot, it is possible to achieve an electronic tuner 1c that shows less deterioration of the electric performance such as the gain and distortion characteristics and has a simple circuit structure.

Besides, the above description illustrates the structures in which the temperature compensating section 11 is provided in the preceding stage or succeeding stage of the first IF signal amplifying circuit 5, or the preceding stage or succeeding stage of the second mixer circuit 71. However, the position of the temperature compensating circuit 11 is not necessarily limited to those described above. When a high frequency amplifying circuit including a field-effect transistor is present on a signal transmission path from the input of the RF signal to the output of the second intermediate frequency signal IF2 by the electronic tuner, the same effects as those mentioned above can be produced by providing the temperature compensating section 11 in other position, for example, in the succeeding stage of the first mixer circuit 31, if it is provided on the path. In particular, when the temperature compensating section 11 is connected to a circuit including a coupling capacitor, such as the preceding stage or succeeding stage of the filter circuit, it is not necessary to newly provide a temperature compensating capacitor. Thus, this configuration is more preferred.

However, the bands of the first and second intermediate frequency signals IF1 and IF2 are narrower than that of the RF signal. More specifically, for example, it is set such that the RF signal is around 47 MHz to 862 MHz, the first intermediate frequency signal IF1 is around 1 GHz with a bandwidth of around 10 MHz, and the second intermediate frequency signal IF2 is around 30 to 60 MHz with a bandwidth of around 10 MHz. Besides, in the United States, it is set such that the second intermediate frequency signal IF2 is 45.75 MHz and the bandwidth is around 6 MHz. Thus, with the structure in which the temperature compensating section 11 is positioned on the transmission path of the first or second intermediate frequency signal IF1 or IF2, matching can be readily achieved and the electronic tuner can be more easily designed.

Furthermore, in the event when the temperature compensating section is provided at a position where the signal level is low, for example, in the succeeding stage of the high frequency amplifying circuit, there is a possibility that the deterioration of the S/N ratio is increased by the passage through the temperature compensating section 11. For this reason, it is preferred to provide the temperature compensating section in the succeeding stage of the high frequency amplifying circuit. Additionally, the above-mentioned double conversion-type electronic tuner often shows the largest variation in gain in the first IF signal amplifying circuit 5. Therefore, for example, as shown in FIG. 1 or FIG. 7, it is preferable to arrange the temperature compensating section 11 between the IF signal amplifying circuit 5 and the second mixer circuit 71. With this arrangement, it is possible to compensate for a variation of the gain in the first IF signal amplifying circuit 5 while limiting the deterioration of the S/N ratio. Besides, when the variation of the gain in the first IF signal amplifying circuit 5 is small but the variation of the gain in the second mixer circuit 71 is large, it is preferable to arrange the temperature compensating section 11 in the succeeding stage of the second mixer circuit 71. With this arrangement, it is possible to limit the deterioration of the S/N ratio and of the distortion characteristic even when the electric field is strong.

[Second Embodiment]

The following description will explain another embodiment of the present invention with reference to the drawings. The first embodiment illustrates the structure for cancelling a variation of the gain in the first IF signal amplifying circuit 5 (second mixer circuit 71) in each of the electronic tuners (1, 1a to 1c) by providing the temperature compensating section 11 formed of the serial circuit composed of the thermistor and capacitor in the preceding stage or succeeding stage of the circuit 5 (71) including the field-effect transistor and by changing the degree of coupling between the circuit and the band-pass filter (4, 6, or 8) according to temperatures.

Figure 9:
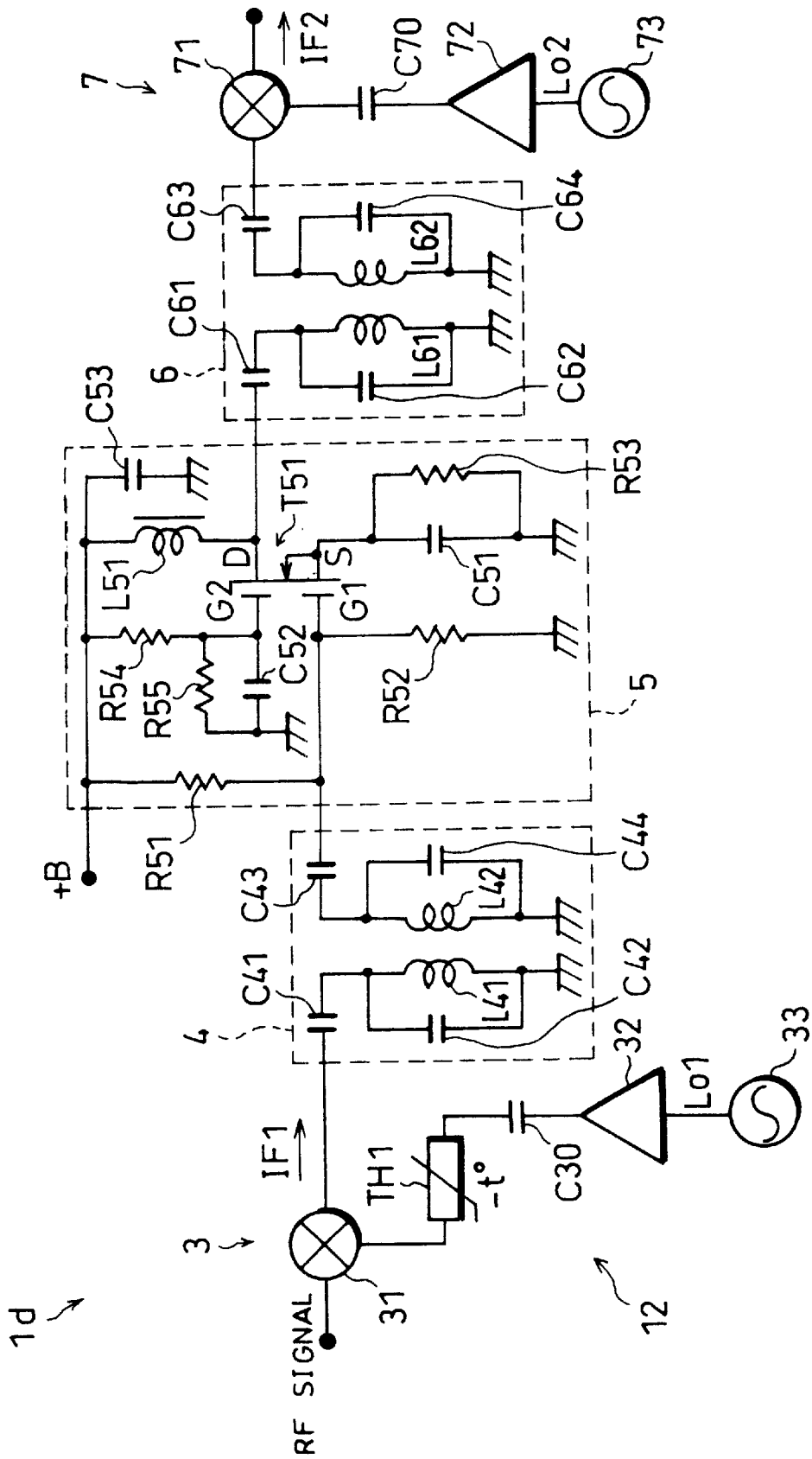
FIG. 9 is a circuit diagram showing the vicinity of the temperature compensating section of an electronic tuner according to another embodiment of the present invention.
Figure 12:
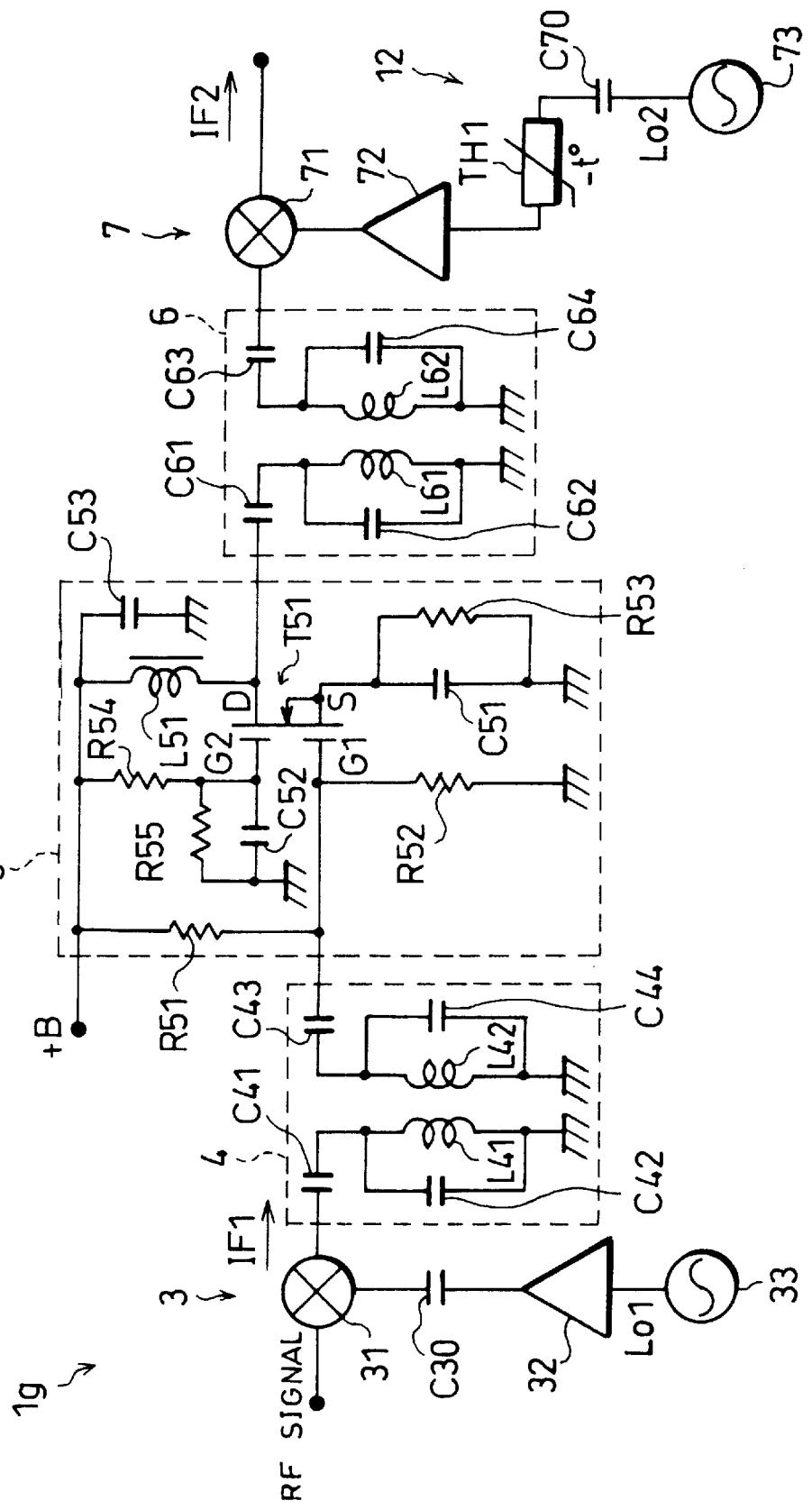
FIG. 12 is a circuit diagram showing the vicinity of the temperature compensating section of an electronic tuner as still another modified example of the above electronic tuner.

In contrast, referring to FIGS. 9 and 12, this embodiment further explains the compensation of a variation of conversion gain resulting from a change in temperature by providing a temperature compensating section between the local oscillator circuit and the mixer circuit in the up-converter or the down-converter as another method of compensating a variation of the gain resulting from a change in temperature.

More specifically, in an electronic tuner 1d according to this embodiment, as shown in FIG. 9, a temperature compensating section 12 is provided between the first mixer circuit 31 and the first local oscillation-use amplifying circuit 32 in the up-converter 3. Like the first embodiment, the temperature compensating section 12 is formed by the serial circuit composed of the NTC-thermistor TH1 and capacitor C30, and the capacitor C30 for coupling the first mixer circuit 31 and first local oscillation-use amplifying circuit 32 is used as a part of the temperature compensating section 12. Moreover, like the first embodiment, the temperature characteristic of the NTC-thermistor TH1 is set so that the resistance is lowered substantially proportional to a rise in temperature as shown in FIG. 3. Furthermore, the output impedance of the first local oscillation-use amplifying circuit 32 is set so as to minimize the matching loss due to a change in temperature by, for example, selecting the circuit constant.

In the above structure, the output of the first local oscillation-use amplifying circuit 32 is applied to the first mixer circuit 31 via the coupling capacitor C30 and the NTC-thermistor TH1. Here, the signal level of the local oscillator signal Lo1 applied to the first mixer circuit 31 is lowered in substantially proportion to a rise in temperature. On the other hand, as described above, since the resistance of the NTC-thermistor TH1 is varied with a change in temperature, the degree of coupling between the first local oscillation amplifier circuit 32 and the first mixer circuit 31 is varied with a change in temperature.

Therefore, in a high temperature condition, the resistance of the NTC-thermistor TH1 decreases, and the degree of coupling between the first local oscillation-use amplifying circuit 32 and the first mixer circuit 31 is increased. Consequently, the level of the local oscillator signal Lo1 input to the first mixer circuit 31 is increased, and a lowering of conversion gain in the first mixer circuit 31 caused by a rise in temperature is compensated. On the contrary, in a low temperature condition, the resistance of the NTC-thermistor TH1 increases, and the degree of coupling between the first local oscillation-use amplifying circuit 32 and the first mixer circuit 31 is decreased. Consequently, the level of the local oscillator signal Lo1 input to the first mixer circuit 31 is decreased, and an increase of the conversion gain in the first mixer circuit 31 caused by a lowering of temperature is compensated. Moreover, as described above, since the first local oscillation-use amplifying circuit 32 is configured so as to optimize the matching characteristic resulting from a change in temperature, the matching loss is limited to a minimum value even when the temperature changes.

As a result, despite an extremely simple circuit structure obtained by only adding the NTC-thermistor TH1 in comparison with a structure having no temperature compensation circuit, like the first embodiment, even when the ambient temperature changes a lot as in the receiver of the digital CATV broadcast in comparison with an analog broadcast receiver, it is possible to achieve the electronic tuner 1d that shows less deterioration of the electric performance such as the gain and distortion characteristics and has a simple circuit structure.

Figure 10:
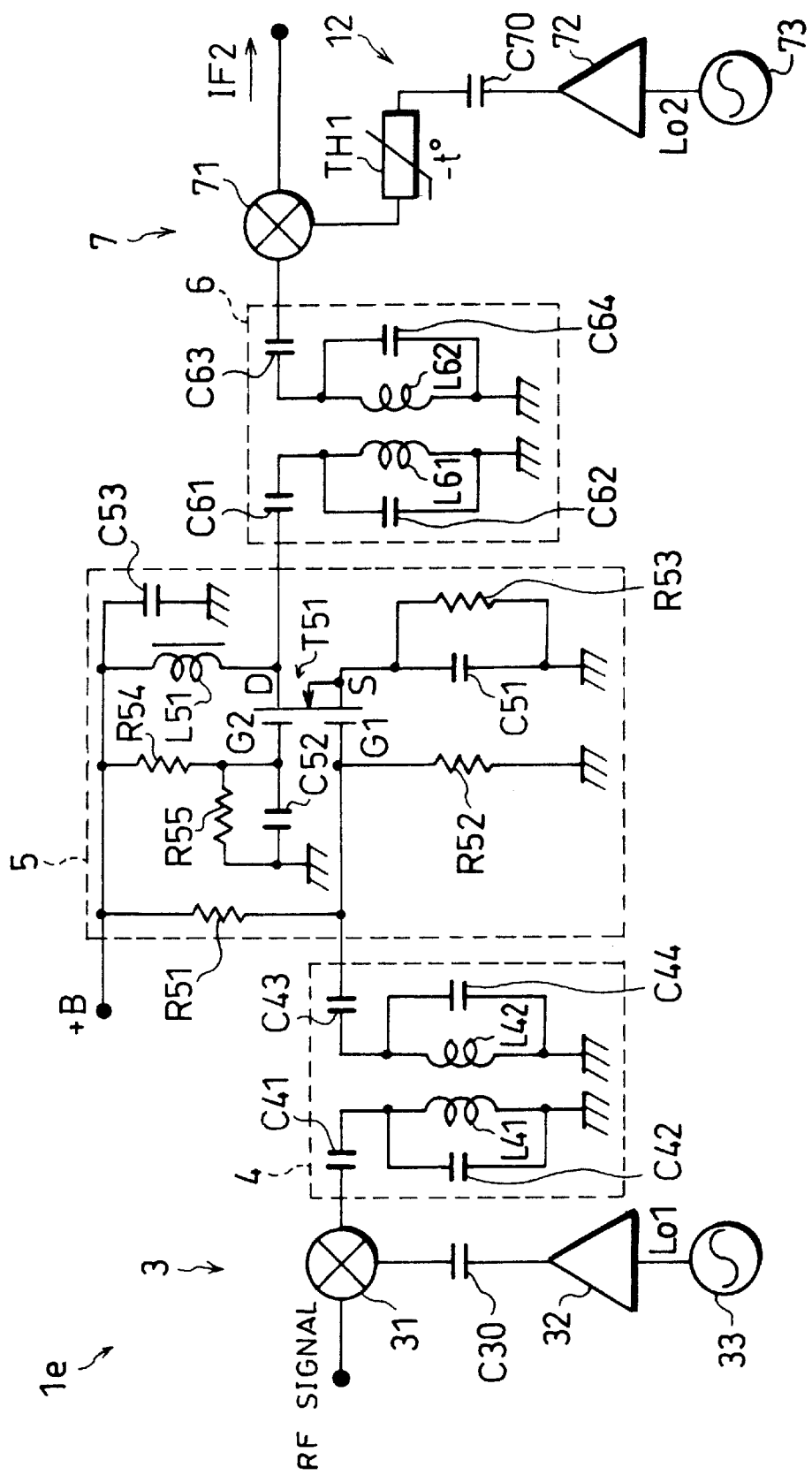
FIG. 10 is a circuit diagram showing the vicinity of the temperature compensating section of an electronic tuner as a modified example of the electronic tuner.

Incidentally, although FIG. 9 illustrates an example in which the temperature compensating section 12 is provided between the first mixer circuit 31 and the first oscillation amplifying circuit 32, the present invention is not necessarily limited to such a structure and, for example, may have the temperature compensating section 12 between the second mixer circuit 71 and the second local oscillation-use amplifying circuit 72 in the down-converter 7 as shown in FIG. 10. In this case, the coupling capacitor C70 is also used for temperature compensation, and the temperature characteristic of the output impedance of the second local oscillation-use amplifying circuit 72 is set in the same manner as in the first local oscillation-use amplifying circuit 32.

In this structure, the degree of coupling between the second local oscillation-use amplifying circuit 72 and the second mixer circuit 71 is varied according to temperatures and a variation of the level of the local oscillator signal Lo2 caused by a change in temperature is compensated, thereby maintaining conversion gain in the second mixer circuit 71. As a result, like FIG. 9, even when the ambient temperature changes a lot, it is possible to achieve an electronic tuner 1e that shows less deterioration of the electric performance such as the gain and distortion characteristics and has a simple circuit structure.

Moreover, while the first local oscillation signal Lo1 has a wide band of frequency ranging from around 1 to around 2 GHz, the frequency of the second local oscillator signal Lo2 is fixed at around 1 GHz. Therefore, in comparison with the electronic tuner 1d shown in FIG. 9, it is possible to readily match the impedances of the respective circuits and more easily design the circuits.

Figure 11:
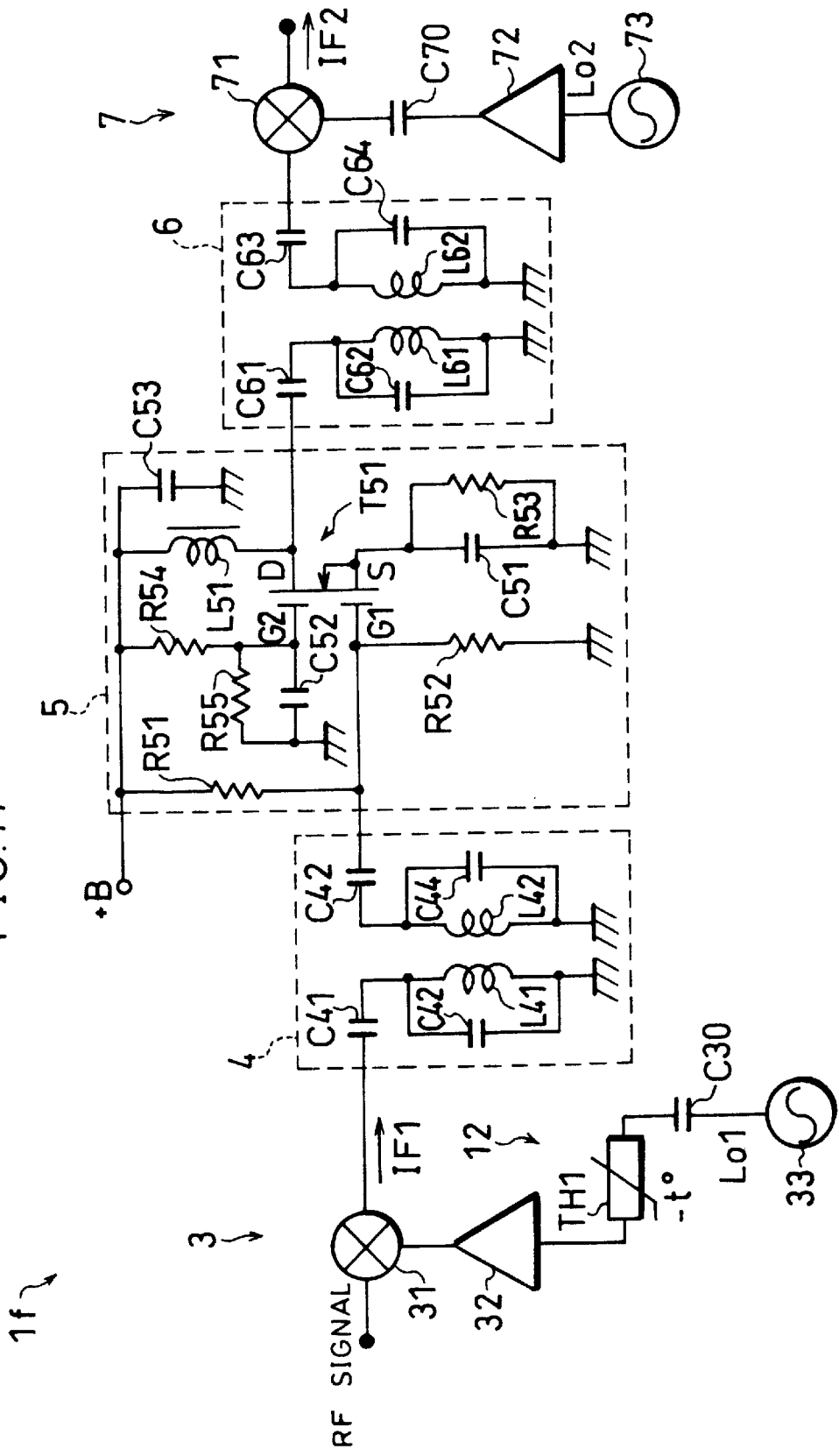
FIG. 11 is a circuit diagram showing the vicinity of the temperature compensating section of an electronic tuner as another modified example of the above electronic tuner.

As another example of the arrangement, the temperature compensating section 12 is positioned between the first local oscillator circuit 33 and the first local oscillation-use amplifying circuit 32. However, in the structure of this modified example, as shown in FIG. 11, the coupling capacitor C30 is not positioned between the first local oscillation-use amplifying circuit 32 and the first mixer circuit 31, but is positioned between the first local oscillator circuit 33 and the first local oscillation-use amplifying circuit 32 and also used for temperature compensation.

In this structure, the degree of coupling between the first local oscillator circuit 33 and the first local oscillation-use amplifying circuit 32 is varied according to temperatures, and a variation of the level of the local oscillator signal Lo1 caused by a change in temperature is compensated and a variation of the conversion gain in the first mixer circuit 31 is maintained. As a result, like FIG. 9, even when the ambient temperature changes a lot, it is possible to achieve an electronic tuner 1f that shows less deterioration of the electric performance such as the gain and distortion characteristics and has a simple circuit structure.

As another example of the arrangement, the temperature compensating section 12 is positioned between the second local oscillator circuit 73 and the second local oscillation-use amplifying circuit 72. In this case, like FIG. 11, the coupling capacitor C70 is positioned between the second local oscillator circuit 73 and the second local oscillation-use amplifying circuit 72 and also used for temperature compensation.

In this structure, the degree of coupling between the second local oscillator circuit 73 and the second local oscillation-use amplifying circuit 72 is varied according to temperatures, and a variation of the level of the local oscillator signal Lo2 caused by a change in temperature is compensated and a variation of the conversion gain in the second mixer circuit 71 is maintained. As a result, like FIG. 10, even when the ambient temperature changes a lot, it is possible to achieve an electronic tuner 1g that shows less deterioration of the electric performance such as the gain and distortion characteristics and has a simple circuit structure.

[Third Embodiment]

The following description will explain still another embodiment of the present invention with reference to the drawings.

Figure 13:
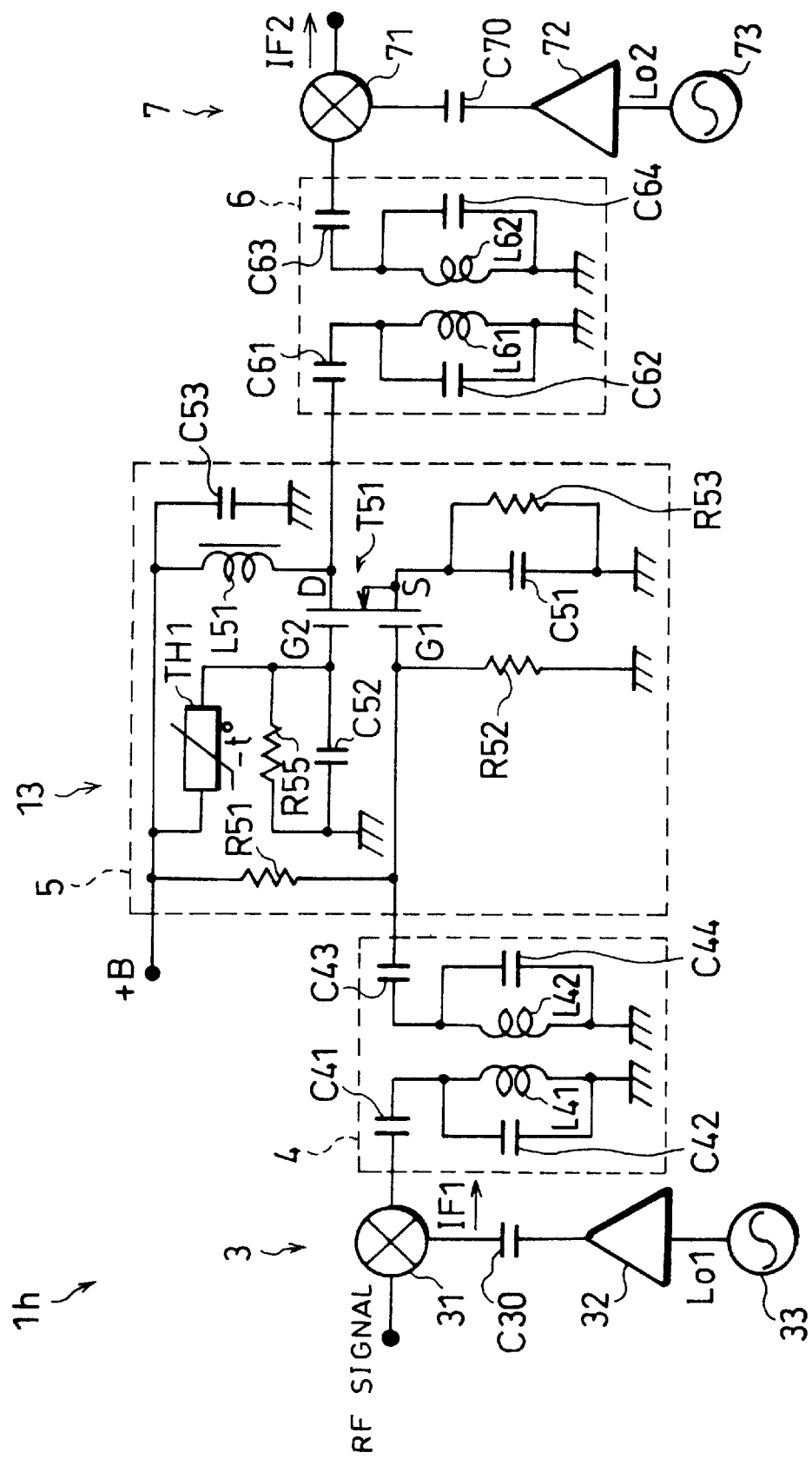
FIG. 13 is a circuit diagram showing the vicinity of the temperature compensating section of an electronic tuner according to still another embodiment of the present invention.

Referring to FIGS. 13 to 16, this embodiment explains, as another temperature compensating method, a structure in which the mixer circuit is formed by using an FET of a dual gate structure and a variation of gain is cancelled by changing the amplification factor of the mixer circuit according to temperatures. Specifically, in an electronic tuner 1h according to this embodiment, as shown in FIG. 13, an NTC thermistor TH1 as a temperature compensating section 13 is provided in the first IF signal amplifying circuit 5, in place of the resistor R54 shown in FIG. 1. Besides, like the first embodiment, the temperature characteristic of the NTC-thermistor TH1 is set so as to limit the variation of the gain in the first IF signal amplifying circuit 5 caused by a change in temperature, more specifically, to decrease the resistance in substantially proportion to a rise in temperature.

In this structure, in the dual-gate-type field-effect transistor T51 of the first IF signal amplifying circuit 5, the voltage of the gate terminal G2 for gain control has a value given by dividing the bias voltage +B by the NTC-thermistor TH1 and bias resistor R55. Here, since the resistance of the NTC-thermistor TH1 is varied with a change in temperature, the voltage of the gate terminal G2 is varied with a change in temperature.

More specifically, in a high temperature condition, the resistance of the NTC-thermistor TH1 decreases, and the voltage of the gate terminal G2 is increased. Consequently, the gain in the first IF signal amplifying circuit 5 is increased, and thereby compensating for a decrease of the gain in the semiconductor (transistor T51) caused by a rise in temperature. On the contrary, in a low temperature condition, the resistance of the NTC-thermistor TH1 increases, and the voltage of the gate terminal G2 is lowered. Consequently, the gain in the first IF signal amplifying circuit 5 is decreased, and thereby compensating for an increase of the gain in the semiconductor caused by a lowering of temperature.

As a result, despite an extremely simple circuit structure obtained by simply replacing the resistor R54 with the NTC-thermistor TH1 in comparison with a structure having no temperature compensating circuit, even when the ambient temperature changes a lot as in the receiver of the digital CATV broadcast in comparison with an analog broadcast receiver, it is possible to achieve the electronic tuner 1*h* that shows less deterioration of the electric performance such as the gain and distortion characteristics and has a simple circuit structure like the first embodiment.

Figure 14:
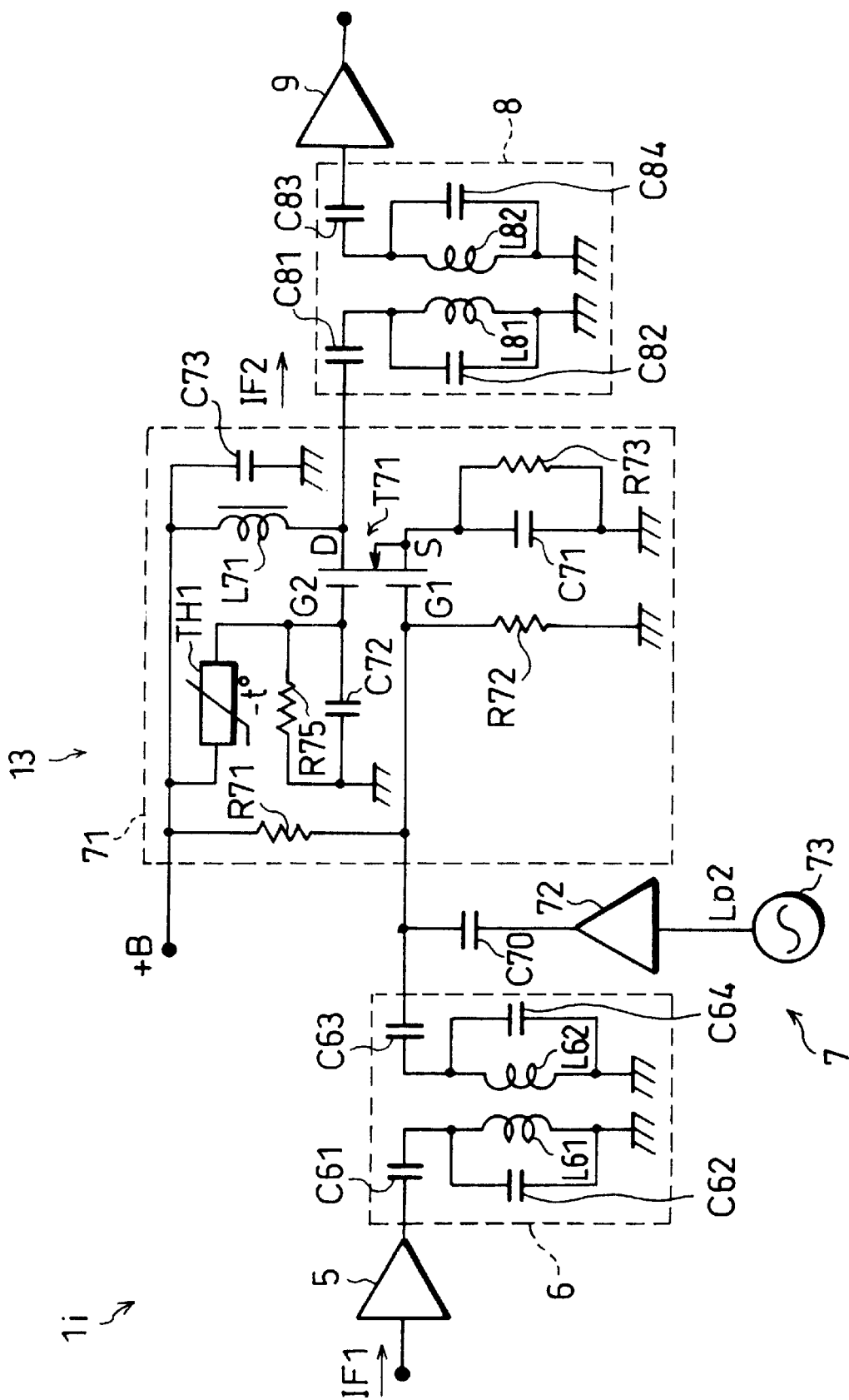
FIG. 14 is a circuit diagram showing the vicinity of the temperature compensating section of an electronic tuner as a modified example of the electronic tuner.

Incidentally, although FIG. 13 illustrates an example in which the temperature compensating section 13 is provided in the first IF signal amplifying circuit 5, the present invention is not necessarily limited to such a structure and may have the temperature compensating section 13, for example, in the second mixer circuit 71 as shown in FIG. 14. In this structure, the NTC-thermistor TH1 as the temperature compensating section 13 is provided in place of the resistor R74 shown in FIG. 7.

In this structure, like the first IF signal amplifying circuit 5 of the electronic tuner 1*h*, in the second mixer circuit 71, the voltage of the gate terminal G2 for gain control has a value given by dividing the bias voltage +B by the NTC-thermistor TH1 and bias resistor R75 and is varied with a change in temperature. Consequently, an increase of the gain in the semiconductor caused by a change in temperature is compensated.

As a result, despite an extremely simple circuit structure obtained by simply replacing the resistor R74 with the NTC-thermistor TH1 in comparison with a structure having no temperature compensating circuit, even when the ambient temperature changes a lot as in the receiver of the digital CATV broadcast in comparison with an analog broadcast receiver, it is possible to achieve an electronic tuner 1*i* that shows less deterioration of the electric performance such as the gain and distortion characteristics and has a simple circuit structure like the above-mentioned electronic tuner 1*h*.

Figure 15:
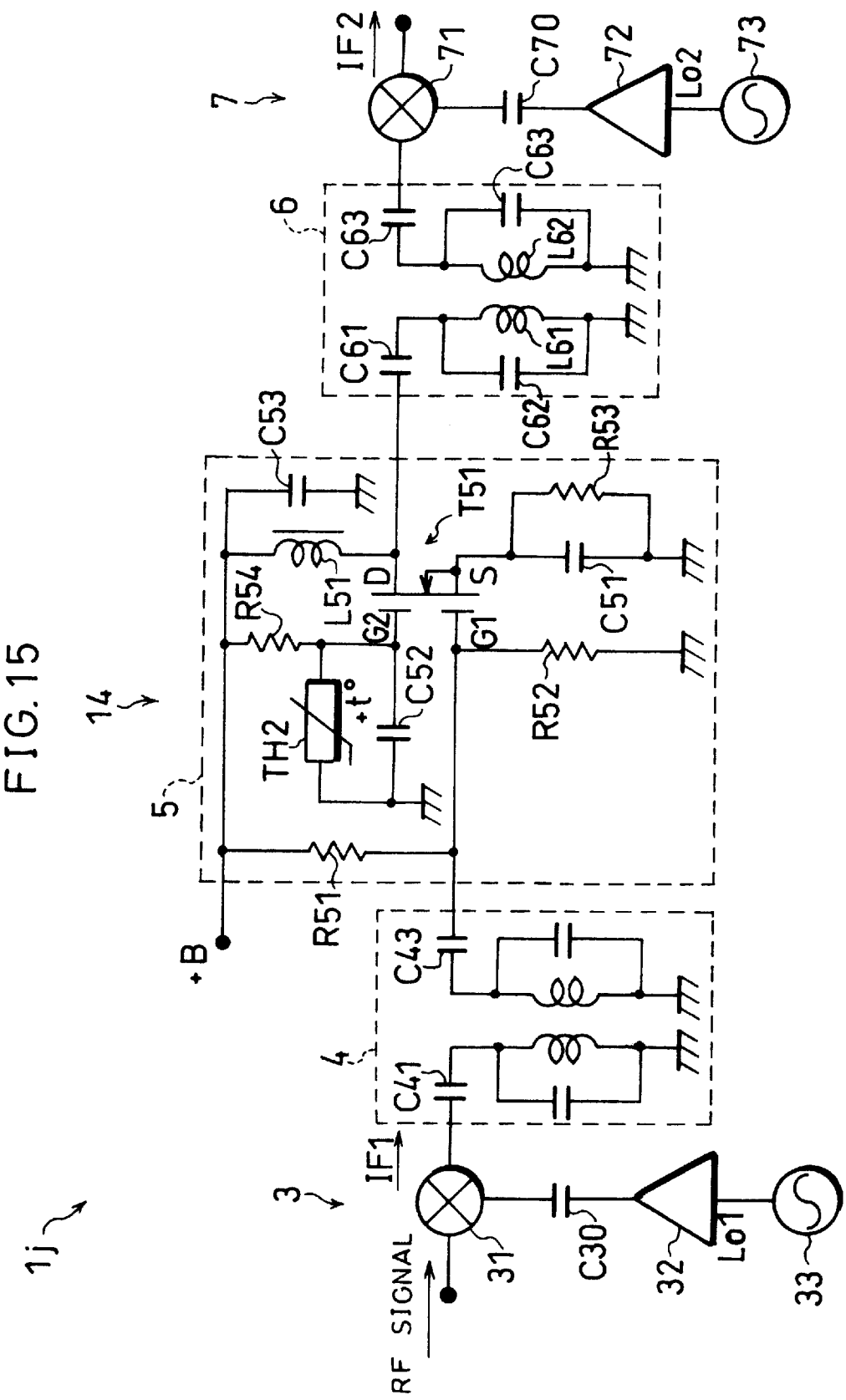
FIG. 15 is a circuit diagram showing the vicinity of the temperature compensating section of an electronic tuner as another modified example of the above electronic tuner.
Figure 16:
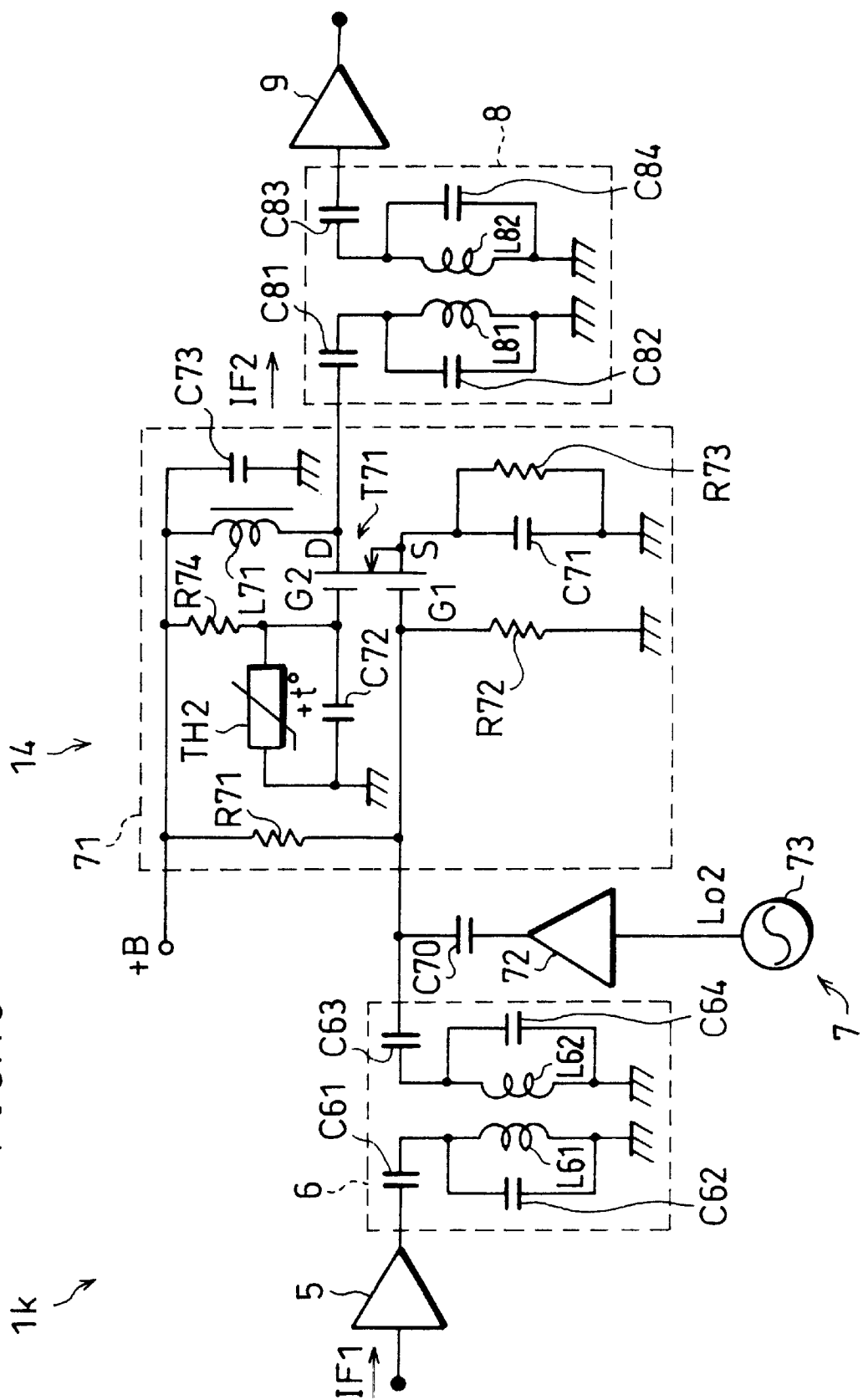
FIG. 16 is a circuit diagram showing the vicinity of the temperature compensating section of an electronic tuner as still another modified example of the above electronic tuner.
Figure 17:
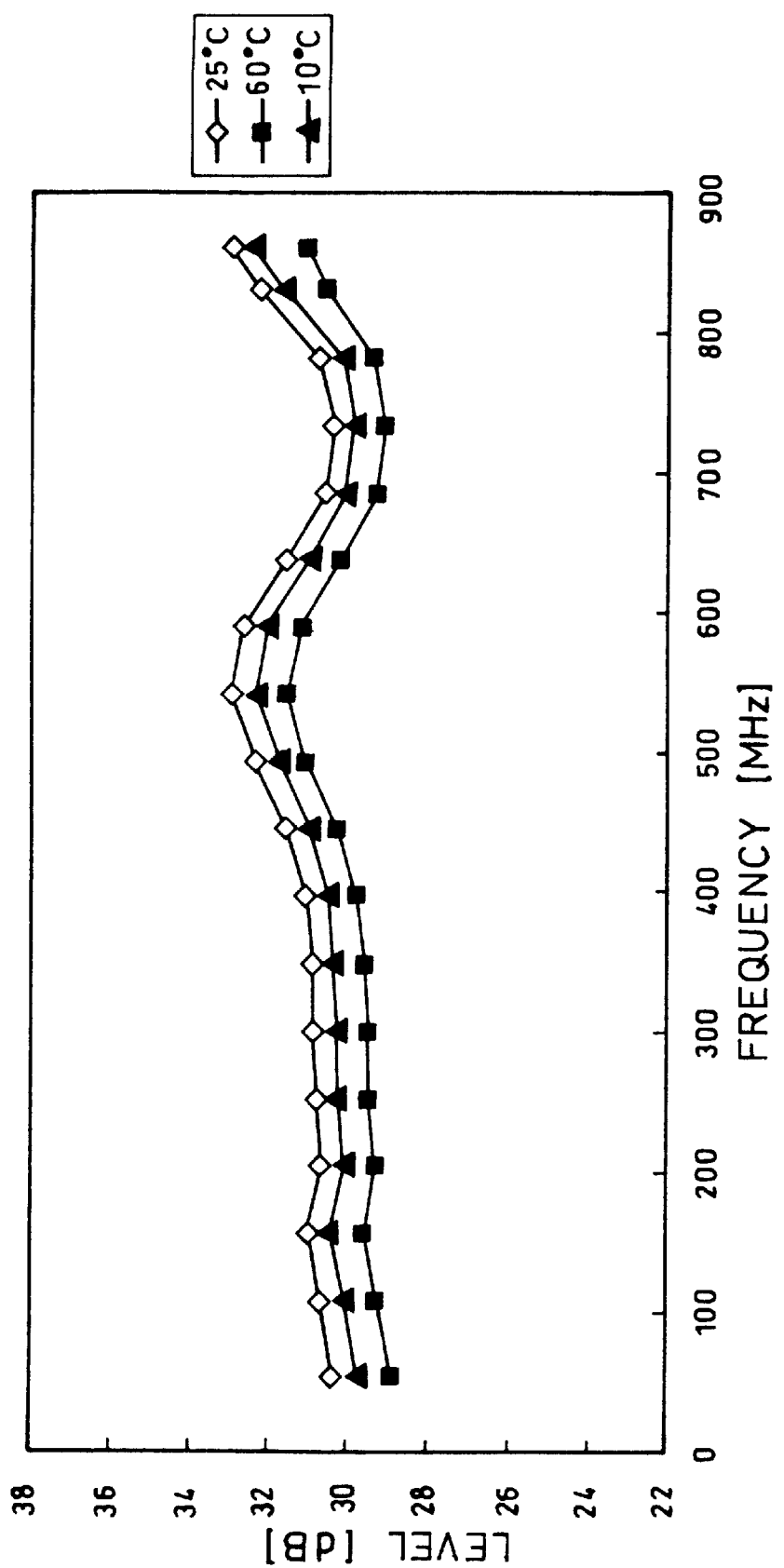
FIG. 17 is a graph showing the relationship between the output signal level and the frequency at a plurality of temperatures in an electronic tuner having a plurality of temperature compensating sections as a modified example of the above embodiments.
Figure 18:
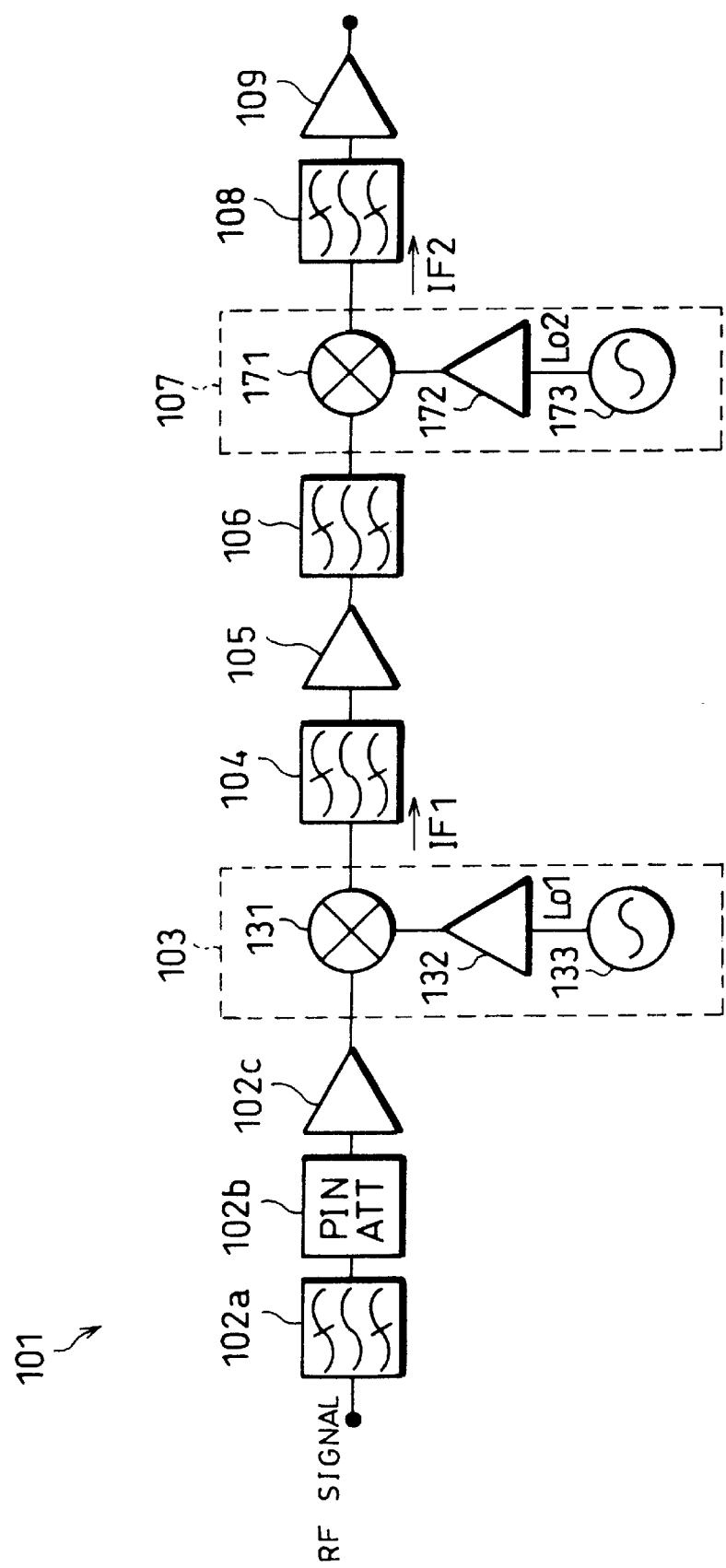
FIG. 18 is a block diagram showing a schematic structure of the essential section of an electronic tuner as a conventional example.
Figure 19:
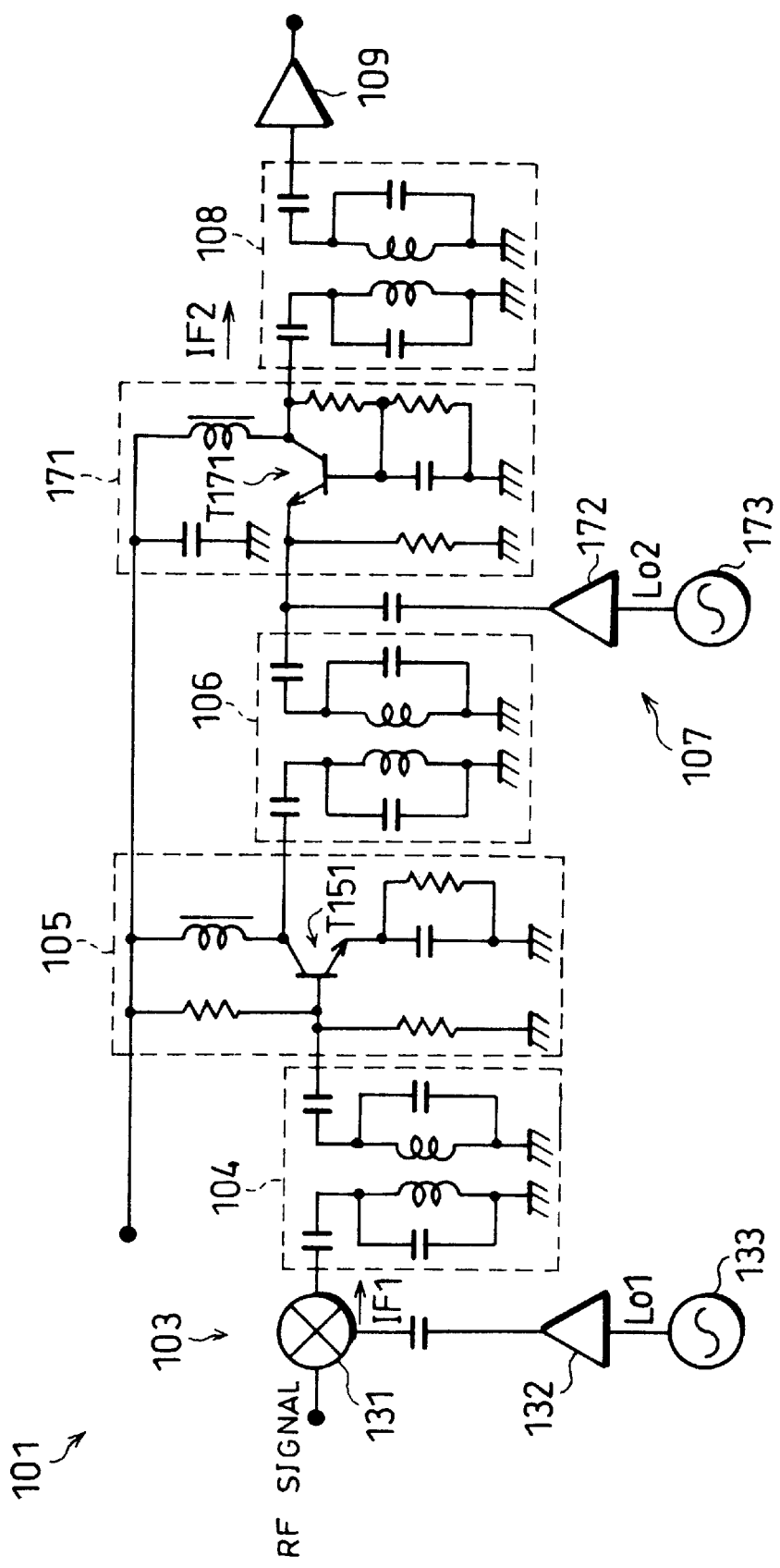
FIG. 19 is a circuit diagram showing an example of the structure in the vicinity of a first IF signal amplifying circuit of the above electronic tuner.

Incidentally, although the above description of the electronic tuners 1*h* and 1*i* illustrate examples in which the temperature compensating section 13 is formed by the NTC-thermistor TH1, it is possible to use a PTC (Positive Temperature Coefficient)-thermistor TH2 (thermistor) as a temperature compensating section 14. Here, unlike the NTC-thermistor TH1 shown FIG. 3, the resistance of the PTC-thermistor TH2 is increased in substantially proportion to a rise in temperature. Therefore, for example, as shown in FIG. 15 (FIG. 16), the PTC-thermistor TH2 is provided in place of the resistor R55 (R75) shown in FIG. 1 (FIG. 7). Besides, as the PTC thermistor TH2, a thermistor having a temperature characteristic that cancels a decrease of the gain in the first IF signal amplifying circuit 5 (second mixer circuit 71) caused by a change in temperature is selected.

In this structure, in the dual-gate-type field-effect transistor T51 (T71) of the first IF signal amplifying circuit 5 (second mixer circuit 71), the voltage of the gate terminal G2 for gain control has a value given by dividing the bias voltage +B by the bias resistor R54 (R74) and the PTC-thermistor TH2. Hence, in a high temperature condition, the resistance of the PTC-thermistor TH2 increases, and the voltage of the gate terminal G2 is increased. Consequently, the gain in the first IF signal amplifying circuit 5 (second mixer circuit 71) is increased, and thereby compensating for a decrease of the gain in the semiconductor (transistor T51) caused by a rise in temperature. On the contrary, in a low temperature condition, the resistance of the PTC-thermistor TH2 decreases, and the voltage of the gate terminal G2 is lowered. Consequently, the gain in the first IF signal amplifying circuit 5 (second mixer circuit 71) is decreased, and thereby compensating for an increase of the gain in the semiconductor caused by a lowering of temperature.

As a result, despite an extremely simple circuit structure obtained by simply replacing the resistor R54 (R74) with the PTC-thermistor TH2 in comparison with a structure having no temperature compensating circuit, even when the ambient temperature changes a lot as in the receiver of the digital CATV broadcast in comparison with an analog broadcast receiver, it is possible to achieve the electronic tuner 1*j* that shows less deterioration of the electric performance such as the gain and distortion characteristics and has a simple circuit structure like the above-mentioned electronic tuner 1*h* (1*i*).

Here, unlike a single-conversion-type electronic tuner, the double conversion-type electronic tuners 1*h* to 1*k* are provided with a PIN attenuator 2*b*, and automatic gain control is performed by the PIN attenuator 2*b*. As a result, in the first IF signal amplifying circuit 5 and/or the mixer circuit 71, even when the gate terminal G2 of the transistor T51 (T71) is used for temperature compensation, it is possible to perform automatic gain control without any problems.

Incidentally, the present embodiment illustrates an example in which the temperature compensating section 13 (14) is provided in the first IF signal amplifying circuit 5 or the second mixer circuit 71. However, for example, even when the temperature compensating section 13 (14) is provided in other position such as in the first mixer circuit 31, the same effect can be obtained if a high frequency amplifying circuit having a dual-gate field-effect transistor as an amplifying element is included. However, in many of the electronic tuners 1, since the first mixer circuit 31 is required to have an extremely high distortion characteristic, a double balance mixer formed of a field-effect transistor or a diode is often used instead of a single field-effect transistor. Hence, as explained in this embodiment, it is preferred to provide the temperature compensating section 13 (14) in the first IF signal amplifying circuit 5 or the second mixer circuit 71.

Additionally, each of the above embodiments illustrate examples in which one temperature compensating section 11, 12 13 or 14 is provided. However, the present invention is not necessarily limited to such examples, and a plurality of temperature compensating sections 11, 12 13 or 14 may be provided. For instance, in the case where both of the temperature compensating section 11 shown in FIG. 1 and the temperature compensating section 11 shown in FIG. 8 are provided, the variation of the gain caused by a change in temperature is compensated in both of the first IF signal amplifying circuit 5 and the second mixer circuit 71. Therefore, despite an extremely simple circuit structure obtained by providing only one additional NTC-thermistor TH1 in comparison with a structure having no temperature compensation circuit, for example, as shown in FIG. 5, the variation of the level of the second intermediate frequency signal IF2 output by the electronic tuner is limited within a range of around 28 [dB] to around 33 [dB] in a frequency band from 100 [MHz] to 800 [MHz] at 10° C., 25° C. and 60° C. As a result, in comparison with the structure having only one temperature compensating section 11 (for example, the structure shown in FIG. 1), the deterioration of the electrical characteristics caused by a change in temperature can be further limited.

As described above, the first electronic tuner of the present invention is a double conversion-type electronic tuner including: an up-converter for converting an input high-frequency signal into a first intermediate frequency signal having a higher frequency than the high frequency signal; a down-converter for converting the first intermediate frequency signal into a second intermediate frequency signal having a lower frequency than the high frequency signal; a filter circuit, disposed on a signal transmission path between the input of the high frequency signal and the output of the second intermediate frequency signal as an output signal, for passing only frequency components within a predetermined band; and a high frequency amplifying circuit, disposed on the signal transmission path, for amplifying the input signal, and characterized by including the following means.

Specifically, the high frequency amplifying circuit includes a field-effect transistor as an amplifying element, and a temperature compensating section is formed by a thermistor that is disposed in the preceding stage or succeeding stage of the filter circuit and has such a characteristic that the resistance is decreased in substantially proportion to a rise in temperature within a predetermined temperature range and a serial circuit composed of the thermistor and a coupling capacitor of the filter circuit. Incidentally, the high frequency amplifying circuit may be a mixer circuit or a high frequency amplifying circuit for amplifying a high frequency signal, or first or second intermediate frequency signal.

In this structure, the gain in the high frequency amplifying circuit having the field-effect transistor is decreased in substantially proportion to the temperature. On the other hand, since the resistance of the thermistor is decreased in substantially proportion to a rise in temperature, the degree of coupling between the circuit provided in the preceding stage of the temperature compensating section and the circuit provided in the succeeding stage is increased. Therefore, the level of the signal output by the temperature compensating section is increased, and thereby compensating for a decrease of the gain in the high frequency amplifying circuit. Here, the coupling capacitor of the filter circuit is also used for temperature compensation. Consequently, despite a simple circuit structure obtained by only adding the thermistor, it is possible to achieve an electronic tuner that provides a substantially constant output signal level within the above-mentioned temperature range. As a result, for example, even when the present invention is applied to an electronic tuner in which the temperature tends to increase as in a multi-channel digital CATV broadcast receiver in comparison with an analog broadcast receiver or a receiver for a small number of channels, it is possible to limit the deterioration of electrical characteristics such as the gain and distortion characteristics, thereby achieving a high-quality electronic tuner.

The second electronic tuner of the present invention has the structure of the first electronic tuner and is characterized by that the filter circuit is a double-tuned circuit including a primary resonant circuit and a secondary resonant circuit and that a resonant capacitor of the resonant circuit located on the thermistor side between the resonant circuits is set to have a temperature characteristic so as to achieve impedance matching with the thermistor, coupling capacitor and high frequency circuit even when the temperature changes.

According to this structure, since the temperature characteristic of the resonant capacitor is set as described above, it is possible to limit the occurrence of matching loss resulting from a change in temperature. As a result, despite a simple structure obtained by simply adding the thermistor, it is possible to realize a high-quality electronic tuner that achieves a higher S/N ratio.

The third electronic tuner of the present invention has the structure of the first or second electronic tuner, and is characterized by that the high frequency amplifying circuit is a circuit for amplifying the first intermediate frequency signal output by the up-converter and the filter circuit is positioned in the succeeding stage of the high frequency amplifying circuit.

According to this structure, the temperature compensating section is positioned between the up-converter and the down-converter. Therefore, in a double conversion-type electronic tuner, in many cases, it is possible to compensate for temperature in a circuit with the largest variation of gain resulting from a change in temperature, i.e., the first intermediate frequency signal amplifying circuit. Moreover, since the temperature compensating section is positioned in the succeeding stage of the high frequency amplifying circuit for amplifying the first intermediate frequency signal, it is possible to limit the deterioration of the S/N ratio in comparison with the structure where the temperature compensating section is positioned in the preceding stage of the high frequency amplifying circuit.

The fourth electronic tuner of the present invention is an electronic tuner including a local oscillator circuit for generating a local oscillator signal having a predetermined frequency, a local oscillator signal amplifying circuit for amplifying an output of the local oscillator circuit and a mixer circuit for generating an intermediate frequency signal by mixing an output of the local oscillator signal amplifying circuit and an input signal, and characterized by including the following means.

A thermistor having such a characteristic that the resistance is decreased in substantially proportion to a rise in temperature within a predetermined temperature range is disposed between the local oscillator signal amplifying circuit and the mixer circuit, and a temperature compensating section is formed by a serial circuit composed of the thermistor and a coupling capacitor provided between the local oscillator signal amplifying circuit and the mixer circuit.

The fifth electronic tuner of the present invention is an electronic tuner including the local oscillator circuit, local oscillator signal amplifying circuit and mixer circuit, and characterized by including a thermistor that is disposed between the local oscillator circuit and the local oscillator signal amplifying circuit and has such a characteristic that the resistance is decreased in substantially proportion to a rise in temperature within a predetermined temperature range, and a temperature compensating section formed by a serial circuit composed of the thermistor and a coupling capacitor provided between the local oscillator circuit and the local oscillation amplifying circuit.

In these structures, the signal level output to the mixer circuit via the local oscillator signal amplifying circuit by the local oscillator circuit is lowered in substantially proportion to the temperature. On the other hand, since the resistance of the thermistor is decreased in substantially proportion to a rise in temperature, the degree of coupling between the circuit positioned in the preceding stage of the temperature compensating section and the circuit in the succeeding stage thereof is increased. Accordingly, the signal level output by the temperature compensating section is increased to compensate for a lowering of the signal level input to the mixer circuit, and thus the conversion efficiency of the mixer circuit is maintained within the above-mentioned temperature range. Here, the coupling capacitor provided between the local oscillator signal amplifying circuit and the mixer circuit or between the local oscillator circuit and the local oscillator signal amplifying circuit is also used for temperature compensation. Therefore, despite a simple circuit structure obtained by only adding a thermistor, it is possible to achieve the electronic tuner that provides a substantially constant output signal level within the above-mentioned temperature range. As a result, for example, even when the present invention is applied to an electronic tuner in which the temperature tends to increase as in a multi-channel digital CATV broadcast receiver in comparison with an analog broadcast receiver or a receiver for a small number of channels, it is possible to limit the deterioration of electrical characteristics such as gain and distortion characteristics, thereby achieving a high-quality electronic tuner.

Moreover, the sixth electronic tuner of the present invention is a double conversion-type electronic tuner including an up-converter for converting an input high frequency signal into a first intermediate frequency signal of a frequency higher than the high frequency signal, a down-converter for converting the first intermediate frequency signal into a second intermediate frequency signal of a frequency lower than the high frequency signal and a high frequency amplifying circuit, disposed on a signal transmission path between the input of the high frequency signal and the output of the second intermediate frequency signal as an output signal, for amplifying the input signal, and characterized in including the following means.

Specifically, the high frequency amplifying circuit includes a dual-gate field-effect transistor as an amplifying element, and a thermistor having such a characteristic that the resistance is decreased in substantially proportion to a rise in temperature within a predetermined temperature range is disposed between a gain control terminal of the dual-gate field-effect transistor and a positive power supply line.

Furthermore, the seventh electronic tuner of the present invention is a double conversion-type electronic tuner including the up-converter, down-converter and high frequency amplifying circuit, and characterized by that the high frequency amplifying circuit includes a dual-gate field-effect transistor as an amplifying element and a thermistor that is disposed between a gain control terminal of the dual-gate field-effect transistor and a negative power supply line and has such a characteristic that the resistance is increased in substantially proportion to a rise in temperature within a predetermined temperature range. Incidentally, in these structures, the high frequency amplifying circuit may be a mixer circuit or a high frequency amplifying circuit for amplifying the high frequency signal, or first or second intermediate frequency signal.

In these structures, the gain in the high frequency amplifying circuit having the dual-gate field-effect transistor is decreased in substantially proportion to the temperature. On the other hand, the resistance of the thermistor is decreased or increased in substantially proportion to a rise in temperature to increase the electric potential of the gain control terminal of the dual-gate field-effect transistor. It is therefore possible to compensate for a decrease of the gain in the high frequency amplifying circuit caused by a rise in temperature. Hence, despite a simple circuit structure obtained by using the dual-gate field-effect transistor as an amplifying element and adding the thermistor, it is possible to achieve an electronic tuner that provides a substantially constant output signal level within the above-mentioned temperature range. As a result, for example, even when the present invention is applied to an electronic tuner in which the temperature tends to increase as in a multi-channel digital CATV broadcast receiver in comparison with an analog broadcast receiver or a receiver with a small number of channels, it is possible to limit the deterioration of electrical characteristics such as gain and distortion characteristics, thereby achieving a high-quality electronic tuner.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic tuner comprising:
   an up-converter for converting an input high frequency signal into a first intermediate frequency signal of a frequency higher than the high frequency signal;
   a down-converter for converting the first intermediate frequency signal into a second intermediate frequency signal of a frequency lower than the high frequency signal;
   a high frequency amplifying circuit, disposed on a signal transmission path between an input of the high frequency signal and an output of the second intermediate frequency signal as an output signal, for amplifying an input signal; and
   a temperature compensating section for compensating for deterioration of electrical characteristics caused by a change in temperature,
   a filter circuit, disposed on the signal transmission path between an input of the high frequency signal and an output of the second intermediate frequency signal as an output signal,
   wherein the high frequency amplifying circuit includes a field-effect transistor as an amplifying element, and
   the temperature compensating section includes:
      a thermistor that is disposed in a preceding stage or succeeding stage of the filter circuit and has such a characteristic that resistance is decreased in substantially proportion to a rise in temperature within a predetermined temperature range; and
      a serial circuit composed of the thermistor and a coupling capacitor of the filter circuit.

2. The electronic tuner as set forth in claim 1, wherein the temperature compensating section is disposed in the succeeding stage of the high frequency amplifying circuit.

3. The electronic tuner as set forth in claim 1, wherein the filter circuit is a double-tuned circuit including a primary resonant circuit and a secondary resonant circuit, between which the resonant circuit on the thermistor side has a resonant capacitor with a temperature characteristic that is set to achieve impedance matching with the thermistor, coupling capacitor and high frequency amplifying circuit even when a temperature is changed.

4. The electronic tuner as set forth in claim 1,
wherein the high frequency amplifying circuit is a circuit for amplifying the first intermediate frequency signal output by the up-converter, and
the filter circuit is disposed in the succeeding stage of the high frequency amplifying circuit.

5. The electronic tuner as set forth in claim 1,
wherein the high frequency amplifying circuit includes a dual-gate field-effect transistor as an amplifying element, and
the temperature compensating section includes a thermistor that is disposed between a gain control terminal of the dual-gate field-effect transistor and a positive power supply line and has such a characteristic that resistance is decreased in substantially proportion to a rise in temperature within a predetermined temperature range.

6. The electronic tuner as set forth in claim 1,
wherein the high frequency amplifying circuit includes a dual-gate field-effect transistor as an amplifying element, and
the temperature compensating section includes a thermistor that is disposed between a gain control terminal of the dual-gate field-effect transistor and a negative power supply line and has such a characteristic that resistance is increased in substantially proportion to a rise in temperature within a predetermined temperature range.

7. The electronic tuner as set forth in claim 1,
wherein the up-converter comprises:
a local oscillator circuit for generating a local oscillator signal of a predetermined frequency;
a local oscillator signal amplifying circuit for amplifying an output of the local oscillator circuit;
a mixer circuit for mixing an output of the local oscillator signal amplifying circuit and an input signal so as to generate the first intermediate frequency signal; and
a second temperature compensating section, provided on at least a signal transmission path between the local oscillation circuit and the mixer circuit, for compensating for deterioration of electrical characteristics caused by a change in temperature.

8. The electronic tuner as set forth in claim 1,
wherein the down-converter comprises:
a local oscillator circuit for generating a local oscillator signal of a predetermined frequency;
a local oscillator signal amplifying circuit for amplifying an output of the local oscillator circuit;
a mixer circuit for mixing an output of the local oscillator signal amplifying circuit and an input signal so as to generate the second intermediate frequency signal; and
a second temperature compensating section, provided on at least a signal transmission path between the local oscillation circuit and the mixer circuit, for compensating for deterioration of electrical characteristics caused by a change in temperature.

9. An electronic tuner comprising:
a local oscillator circuit for generating a local oscillator signal of a predetermined frequency;
a local oscillator signal amplifying circuit for amplifying an output of the local oscillator circuit;
a mixer circuit for mixing an output of the local oscillator signal amplifying circuit and an input signal so as to generate an intermediate frequency signal; and
a temperature compensating section, provided on at least a signal transmission path between the local oscillation circuit and the mixer circuit, for compensating for deterioration of electrical characteristics caused by a change in temperature.

10. The electronic tuner as set forth in claim 9,
wherein the temperature compensating section is formed by a serial circuit composed of a thermistor, which is disposed between the local oscillator signal amplifying circuit and the mixer circuit and has such a characteristic that resistance is decreased in substantially proportion to a rise in temperature within a predetermined temperature range, and a coupling capacitor provided between the local oscillator signal amplifying circuit and the mixer circuit.

11. The electronic tuner as set forth in claim 9,
wherein the temperature compensating section is formed by a serial circuit composed of a thermistor, which is disposed between the local oscillator circuit and the local oscillator signal amplifying circuit and has such a characteristic that resistance is decreased in substantially proportion to a rise in temperature within a predetermined temperature range, and a coupling capacitor provided between the local oscillator circuit and the local oscillator signal amplifying circuit.

12. The electronic tuner as set forth in claim 9,
wherein an output impedance of the local oscillator signal amplifying circuit is set so as to minimize matching loss caused by a change in temperature.

13. The electronic tuner as set forth in claim 5,
wherein the high frequency amplifying circuit is a mixer circuit.

14. The electronic tuner as set forth in claim 6,
wherein the high frequency amplifying circuit is a mixer circuit.

15. The electronic tuner as set forth in claim 6,
wherein the up-converter comprises:
a local oscillator circuit for generating a local oscillator signal of a predetermined frequency;
a local oscillator signal amplifying circuit for amplifying an output of the local oscillator circuit;
a mixer circuit for mixing an output of the local oscillator signal amplifying circuit and an input signal so as to generate the first intermediate frequency signal; and
a second temperature compensating section, provided on at least a signal transmission path between the local oscillation circuit and the mixer circuit, for compensating for deterioration of electrical characteristics caused by a change in temperature.

* * * * *